(12) United States Patent
Choo et al.

(10) Patent No.: US 7,374,798 B2
(45) Date of Patent: May 20, 2008

(54) METHOD AND APPARATUS OF FORMING ALIGNMENT FILM

(75) Inventors: Dae-Ho Choo, Yong-si (KR); Hak-Jin Kim, Osan-si (KR); Bong-Woo Lee, Cheonan-si (KR)

(73) Assignee: Samsung Electronics, Co. Ltd., Suwon-Si (KR)

( * ) Notice: Subject to any disclaimer, the term of this patent is extended or adjusted under 35 U.S.C. 154(b) by 820 days.

(21) Appl. No.: 10/689,729

(22) Filed: Oct. 22, 2003

(65) Prior Publication Data

US 2005/0011861 A1   Jan. 20, 2005

(30) Foreign Application Priority Data

Nov. 27, 2002   (KR) .................. 10-2002-0074478

(51) Int. Cl.
B05D 3/06 (2006.01)
B29C 71/04 (2006.01)
G02F 1/1337 (2006.01)

(52) U.S. Cl. .............. 427/532; 427/551; 349/123; 349/124; 349/125; 349/126

(58) Field of Classification Search ........... 427/551, 427/532; 349/123–126
See application file for complete search history.

(56) References Cited

U.S. PATENT DOCUMENTS 6,665,033 B2 *  12/2003  Callegari et al. .......... 349/123
2004/0092617 A1 *  5/2004  Choo et al. .................. 522/4

* cited by examiner

Primary Examiner—William Phillip Fletcher, III
Assistant Examiner—Cachet I Sellman
(74) Attorney, Agent, or Firm—F. Chau & Associates, LLC.

(57) ABSTRACT

In a method of manufacturing an LCD device, an atomic beam is irradiated onto a thin film including a carbon-carbon double bond to form a polarized functional group by transforming the carbon-carbon double bond into a carbon-carbon single bond and a radical state. Then, a polarity preserving material is combined with the polarized functional group so as to preserve a polarity of the polarized functional group. According to the present invention, the alignment film is formed on the thin film transistor unit cell and on the color filter unit cell by a non-contact method. Therefore, time of forming the alignment film is reduced and alignment of the liquid crystal molecules is improved.

20 Claims, 30 Drawing Sheets

METHOD AND APPARATUS OF FORMING ALIGNMENT FILM

CROSS-REFERENCE TO RELATED APPLICATIONS

This application relies for priority upon Korean Patent Application No.2002-74478 filed on Nov. 27, 2002, the contents of which are herein incorporated by reference in its entirety.

BACKGROUND OF THE INVENTION

1. Field of the Invention

The present invention relates to a method and an apparatus of forming an alignment film, and more particularly to a non-contacting method and an apparatus of forming an alignment film.

2. Description of the Related Art

In general, a liquid crystal display device is lighter and smaller than other display devices comparatively. The liquid crystal display devices are manufactured via many manufacturing processes.

A first process for manufacturing the liquid crystal display device includes a forming of thin film transistor (TFT) unit cells on a first mother substrate and a forming of color filter unit cells on a second mother substrate. One example of the first process for manufacturing the liquid crystal display device is disclosed in U.S. Pat. No. 6,391,137 (entitled 'method for manufacturing display device').

A second process for manufacturing the liquid crystal display device includes a rubbing process. Liquid crystal layer disposed between the thin film transistor unit cell and the color filter unit cell is aligned via the rubbing process on the thin film transistor unit cells and the color filter unit cells. One example of the second process is disclosed in U.S. Pat. No. 5,879,497 (entitled 'Alignment Device and Rubbing Cloth for Alignment with respect to Liquid Crystal Display Device-use Substrate, and Method for Manufacturing a Liquid Crystal Display Device'). A cylindrical roller covered by a piled fabric (or rubbing cloth) having pile rolls on the alignment film, so that an alignment groove is formed on the alignment film. The alignment groove creates pre-tilt angles of liquid crystal molecules of the liquid crystal layer.

One example of a third process for manufacturing the liquid crystal display device is disclosed in the U.S. Pat. No. 6,397,137. The third process includes an assembly process for assembling the first mother substrate and the second mother substrate. The first mother substrate and the second mother substrate are assembled such that the thin film transistor unit cells of the first mother substrate face the color filter unit cells of the second mother substrate unit cell. Hereinafter, the first mother substrate and second mother substrate are referred to as an 'assembled substrate', and the thin film transistor unit cell and color filter unit cell are referred to as a 'liquid crystal display device unit cell'.

One example of a fourth process for manufacturing the liquid crystal display device is disclosed in the U.S. Pat. No. 6,397,137. The fourth process includes a scribe-and-break process for scribing and separating the liquid crystal display device unit cells from the assembled substrate. One liquid crystal display device unit cell separated from the assembled substrate is referred to as a 'liquid crystal display panel'.

A fifth process for manufacturing the liquid crystal display device includes a test process. A test driving signal is applied to the liquid crystal display panel for testing the liquid crystal display panel.

A sixth process for manufacturing the liquid crystal display device includes a liquid crystal injection process for injecting liquid crystal into a cell gap disposed between the first mother substrate and the second mother substrate, and cell gap modulating process for modulating the size of the cell gap.

A seventh process for manufacturing the liquid crystal display device includes a polarizing plate attaching process and module process. A polarizing plate (or polarizing plates) is (are) attached on the liquid crystal display panel via the polarizing plate attaching process. A driving module for driving the liquid crystal display panel is installed on the liquid crystal display panel via the module process. Hereinafter, the liquid crystal display device having the driving module is referred to as a 'liquid crystal display panel assembly'.

Generally, the sequence of the conventional manufacturing processes has been maintained, and the failures occurring during each of the processes has been reduced.

However, the conventional manufacturing processes has some critical problems.

For example, a process speed of each of processes is different from each other. In detail, a process speed of the first through the third processes is different from that of the fourth through the seventh processes. In general, the process speed of the first through the third processes is faster than that of the fourth through the seventh processes. Namely, the process speed of the processes of manufacturing the thin film transistor unit cell, the color filter unit cell and the assembled substrate is faster than the process speed of the scribe process, separation process, the test process, the liquid crystal injection process, polarizing plate attaching process and the module process.

Therefore, the assembled substrate that has passed through the third process should stand by for a predetermined time so as to undergo the fourth process. The longer the assembled substrate stands by, the lower is the productivity of the liquid crystal display device.

More equipment may be established in the fourth through the seventh processes in order to solve above problem. In other word, extensions of equipment may increase the productivity of the liquid crystal display devices. However, the greater the number of the equipment is, the higher is the manufacturing cost.

Further, the conventional manufacturing processes have many problems.

A first problem occurs in the rubbing process. The rubbing process for aligning the liquid crystal molecules has the following problem. The roller is covered with a piled fabric having pile rolls on the alignment film, so that an alignment groove is formed on the alignment film. The alignment groove creates pre-tilt angles of liquid crystal molecules of the liquid crystal layer.

However, many particles are generated as a byproduct in the conventional rubbing process. The particles may induce failures during the rubbing process. In order to eliminate the particles, a cleaning process is needed. The cleaning process includes a chemical cleaning process in which chemical cleaning agent resolves the particles and the particles are removed, a process for removing the chemical cleaning agent by pure water, and a dry process for removing the pure water. Accordingly, the time for manufacturing the liquid crystal display device may be increased due to the cleaning process.

Further, according to the conventional rubbing process, the rubbing cloth is replaced by a new rubbing cloth or the rubbing cloth that is cleaned periodically. Therefore, the conventional rubbing process cannot be successfully performed and the efficiency of manufacturing the liquid crystal display device is lowered.

Moreover, in the conventional rubbing process, the piled fabric (rubbing cloth) having pile forms alignment grooves on the alignment film. Therefore, defects of the alignment grooves are seldom detected, when the alignment grooves are already formed. The defects of the alignment grooves may be detected in the reliability test of the liquid crystal display device after the liquid crystal display device is completely manufactured. The liquid crystal display device having a defect of the alignment groove lowers image display quality.

A second problem occurs after the assembled substrate is manufactured. When the assembled substrate is manufactured, the liquid crystal display device unit cells are separated from the assembled substrate, and each of the liquid crystal display panels are manufactured using each of the liquid crystal display device unit cells. Input terminals and (or) output terminals are exposed to the air, and the input/output terminals are oxidized, so that a thin oxidation film may be formed on the surface of the input/output terminals. The thin oxidation film deteriorates electrical characteristics of the input/output terminals. Therefore, display quality of the liquid crystal display device is lowered.

A fourth problem occurs in the module process. Liquid crystal is injected into liquid crystal display panel and a polarizing plate is attached onto the liquid crystal display panel. The polarizing plate is attached onto each of the liquid crystal display panels separated from the assembled substrate one by one. Therefore, much time is required so as to attach the polarizing plate onto the assembled substrate.

In order to overcome above problem, the polarizing plate may be attached onto the assembled substrate. Then, the polarizing plate attached onto the assembled substrate is cut off, so that a liquid crystal display device unit cell having a polarizing plate on is manufactured. However, it is hard to detect the defect of the liquid crystal display device unit cell before cutting off the assembled substrate. When a polarizing plate is attached onto a defective liquid crystal display unit cell, the polarizing plate is wasted.

SUMMARY OF THE INVENTION

Accordingly, it is provided a method and an apparatus of forming an alignment film by a contacting method.

According to the method, an atomic beam is irradiated onto a thin film including a carbon-carbon double bond to form a polarized functional group by transforming the carbon-carbon double bond into a carbon-carbon single bond and a radical state. Then, a polarity preserving material is combined with the polarized functional group so as to preserve a polarity of the polarized functional group.

The apparatus of forming an alignment film includes an atomic beam irradiating part and a polarization maintaining part. The atomic beam irradiating part irradiates an atomic beam onto a thin film including a carbon-carbon double bond to form a polarized functional group by transforming the carbon-carbon double bond into a carbon-carbon single bond and a radical state. The polarization maintaining part combines a polarity preserving material with the polarized functional group so as to preserve a polarity of the polarized functional group.

According to the present invention, the alignment film is formed on the thin film transistor unit cell and on the color filter unit cell by a non-contact method. Therefore, time for forming the alignment film is reduced and alignment of the liquid crystal molecules is improved.

BRIEF DESCRIPTION OF THE DRAWINGS

The above and other features and advantages of the present invention will become more apparent by describing in detail the embodiments thereof with a respect to the accompanying drawings, in which.

DESCRIPTION OF EXAMPLARY EMBODIMENTS

Hereinafter the preferred embodiment of the present invention will be described in detail with reference to the accompanying drawings.

Figure 1:
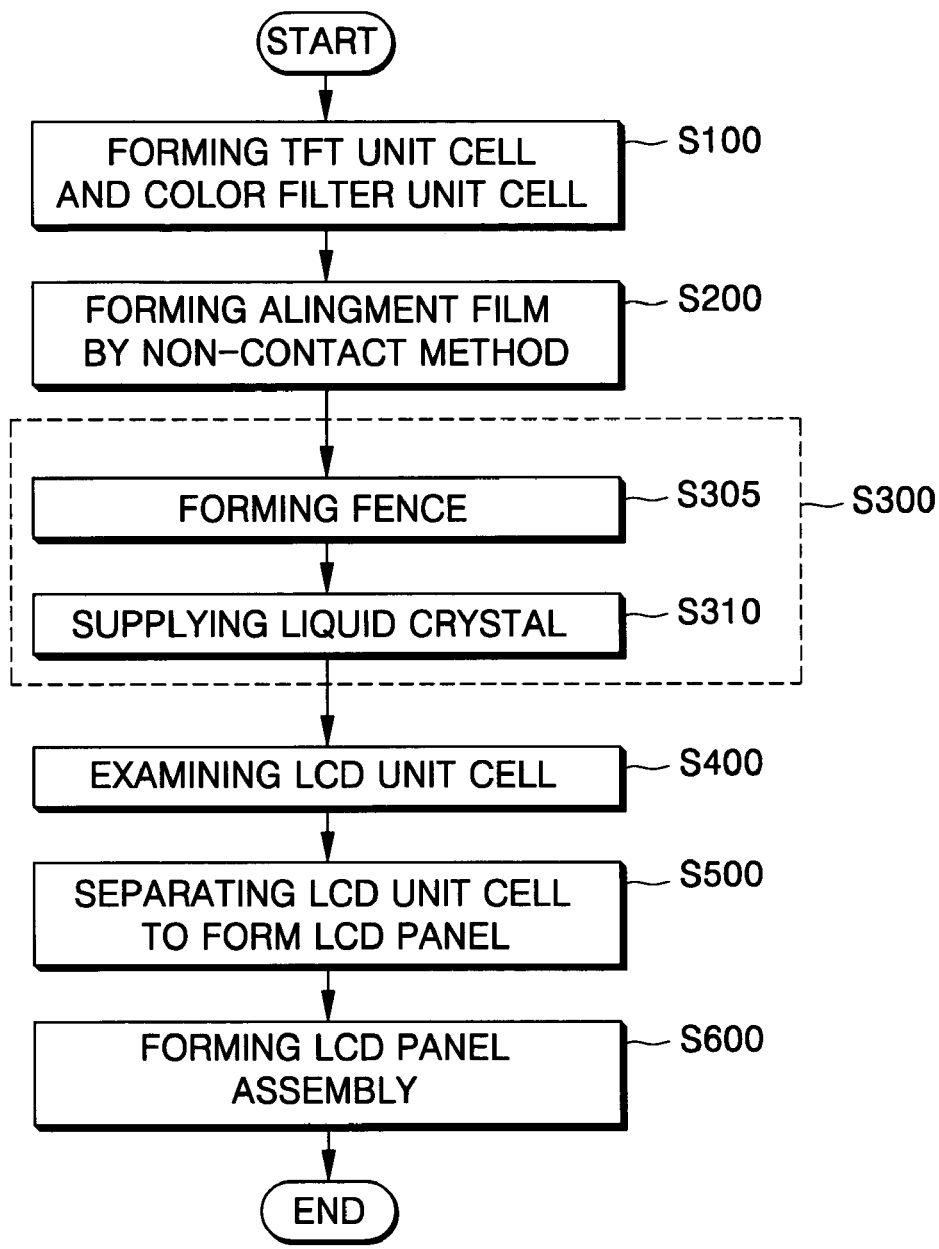
FIG. 1 is a flow chart showing a method of manufacturing a liquid crystal display device according to a first exemplary embodiment.

FIG. 1 is a flow chart showing a method of manufacturing a liquid crystal display device according to a first exemplary embodiment.

Referring to FIG. 1, at least one thin film transistor unit cells is formed on a first mother substrate, and at least one color filter unit cells is formed on a second mother substrate (step S100). The thin film transistor unit cell formed on the first mother substrate and the color filter unit cell formed on the second mother substrate are formed via a different process from each other.

Figure 2:
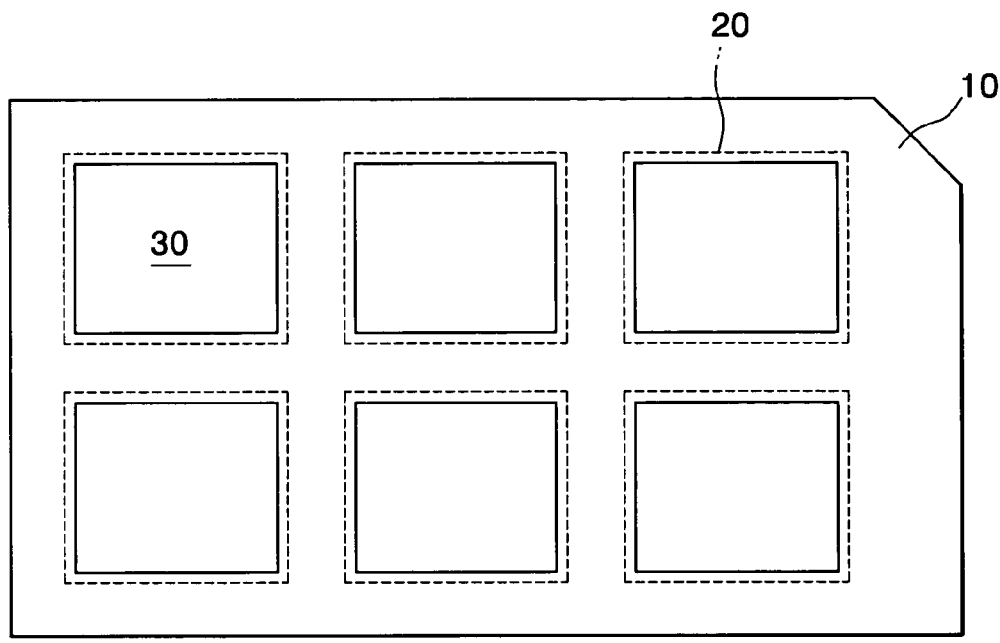
FIG. 2 is a schematic view showing a first mother substrate and thin film transistor unit cell regions formed on the first mother substrate according to the first exemplary embodiment.

FIG. 2 is a schematic view showing a first mother substrate and thin film transistor unit cell regions formed on the first mother substrate according to the first exemplary embodiment.

Referring to FIG. 2, at least one thin film transistor unit cell regions 20 is formed on the first mother substrate 10.

For example, a size of the first mother substrate 10 is about 1600 mm×1400 mm. The first mother substrate 10 may includes a glass substrate that is transparent and has a good heat-resisting property.

The thin film transistor unit cell region 20 is surrounded by a dotted line. For example, six thin film transistor unit cell regions 20 are formed on the first mother substrate 10. A thin film transistor unit cell 30 is formed in each of the thin film transistor unit cell regions 20.

Figure 3:
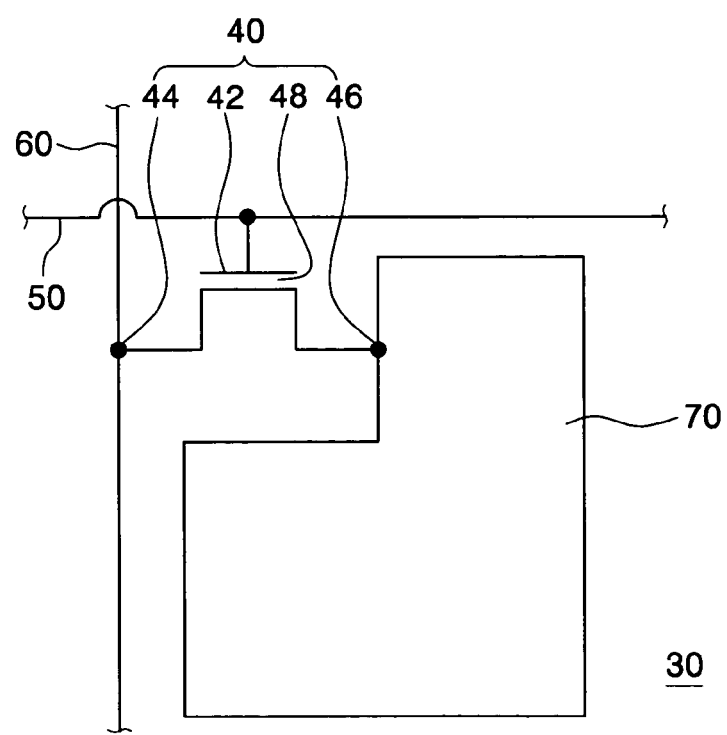
FIG. 3 is a schematic view showing a pixel electrode and a thin film transistor of a thin film transistor unit cell formed in the thin film transistor unit cell region of FIG. 2.
Figure 4:
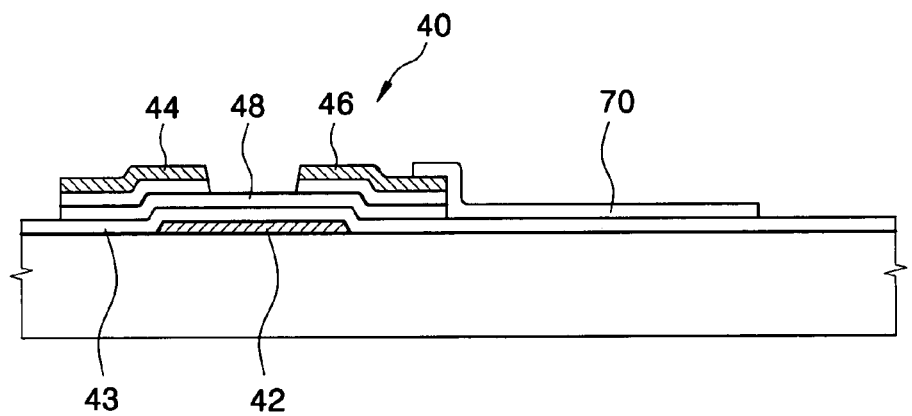
FIG. 4 is a cross-sectional view showing a pixel electrode and a thin film transistor of FIG. 3.

FIG. 3 is a schematic view showing a pixel electrode and a thin film transistor of a thin film transistor unit cell formed in the thin film transistor unit cell region of FIG. 2, and FIG. 4 is a cross-sectional view showing a pixel electrode and a thin film transistor of FIG. 3.

Referring to FIGS. 3 and 4, a thin film transistor unit cell 30 includes at least one thin film transistor 40, a gate line 50, a data line 60 and a pixel electrode 70.

For example, when a resolution of a liquid crystal display device is 1024×768, a number of the thin film transistors 40 formed on a thin film transistor unit cell region 20 of FIG. 2 are 1024×768×3. The thin film transistors 40 are arranged in a matrix shape on the thin film transistor unit cell region 20 of FIG. 2.

Referring to FIG. 4, the thin film transistor 40 includes a gate electrode 42, a gate insulation layer 43, a source electrode 44, a drain electrode 46 and a channel layer 48.

Referring again to FIG. 3, the gate line 50 is formed through the same process of forming the gate electrode 42. The gate electrodes 42 of the thin film transistors 40 are electrically connected with each other via the gate line 50.

The data line 60 is formed through the same process as in forming the source electrode 44 and the drain electrode 46 of the thin film transistor 40. The source electrodes 44 of the thin film transistors 40 are electrically connected with each other via the data line 60.

The pixel electrode 70 includes a material that has high light-transmissivity and high electric conductivity. For example, the pixel electrode 70 includes indium tin oxide (ITO) or indium zinc oxide (IZO). One pixel electrode 70 is formed in each of the thin film transistor 40, and electrically connected with the drain electrode 46 of the thin film transistor 40.

Figure 5:
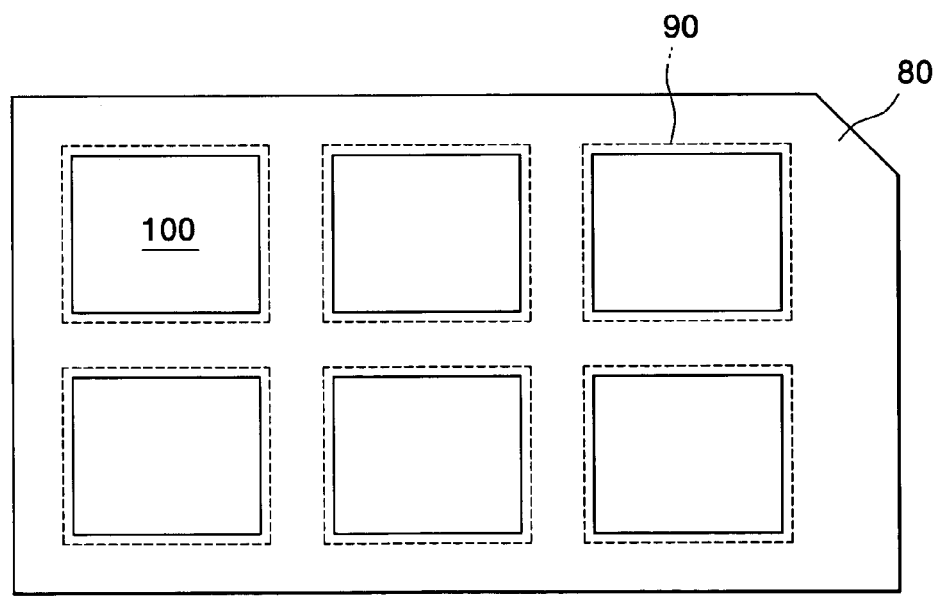
FIG. 5 is a schematic view showing a second mother substrate and color filter unit cell regions formed on the second mother substrate according to the first exemplary embodiment.

FIG. 5 is a schematic view showing a second mother substrate and color filter unit cell regions formed on the second mother substrate according to the first exemplary embodiment.

Referring to FIG. 5, a size of the second mother substrate 80 is about 1600 mm×1400 mm, for example, the second mother substrate 80 may include a glass substrate that is transparent and has a good heat-resisting property.

A color filter unit cell region 90 is surrounded by a dotted line in FIG. 5. At least one color filter unit cell region 90 is formed on the second mother substrate 80. For example, six color filter unit cell regions 90 are formed on the second mother substrate 80. A color filter unit cell 100 is formed in each of the color filter unit cell regions 90.

Figure 6:
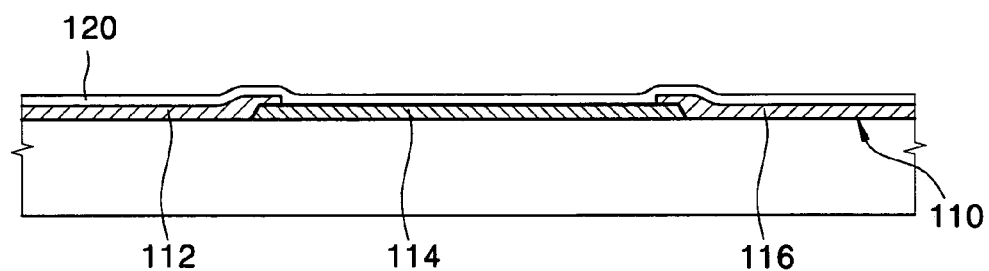
FIG. 6 is a cross-sectional view showing a portion of a color filter unit cell of FIG. 5.

FIG. 6 is a cross-sectional view showing a portion of a color filter unit cell of FIG. 5.

Referring to FIG. 6, a color filter unit cell 100 of FIG. 5 includes a color filter 110 and a common electrode 120.

The color filter 110 includes a red-color filter 112, a green-color filter 114 and a blue-color filter 116. The red-color filter 112 filters white light, so that only light having a wavelength corresponding to a red-color visible light may pass through the red-color filter 112. The green-color filter 114 filters white light, so that only light having a wavelength corresponding to a green-color visible light may pass through the green-color filter 114. The blue-color filter 116 filters white light, so that only light having a wavelength corresponding to a blue-color visible light may pass through the blue-color filter 116. Each of the red-color filter 112, the green color filter 114 and the blue color filter 116 faces the pixel electrode 70 of FIG. 3.

The common electrode 120 includes a material that has a good light-transmissivity and a good electric conductivity. For example, the common electrode 120 includes indium tin oxide (ITO) or indium zinc oxide (IZO). The common electrode 120 is formed on the color filter 110 and it is formed in the entire region of the color filter unit cell region 90 of FIG. 5.

Referring again to FIG. 1, after the thin film transistor unit cell 30 is formed on the first mother substrate 10, and the color filter unit cell 100 is formed on the second mother substrate 80, liquid crystal molecules are aligned by a non-contact aligning method (step S200). The molecular orientation of the liquid crystal is set by a non-contact aligning method.

The non-contact aligning method solves the problem that occurs when the liquid crystal molecules are aligned by the conventional rubbing process using a polyimide film as an alignment film.

The first mother substrate 10 including at least one thin film transistor unit cell 30 and the second mother substrate 80 including at least one color filter unit cell 100 are erected to be disposed parallel to the gravitational force direction and transferred to a place where next process is carried out by auto guided vehicle (AGV) or manual guided vehicle (MGV).

The first mother substrate 10 and the second mother substrate 80 have a large surface area, so that many problems such as sagging may happen due to the large surface area of the first mother substrate 10 and the second mother substrate 80. Therefore, the first mother substrate 10 and the second mother substrate 80 are erected and transferred so as to settle the problems. For example, when the first mother substrate 10 and the second mother substrate 80 are laid down to be disposed substantially perpendicular to the gravitational force direction and transferred, the first mother substrate 10 and the second mother substrate 80 may sag due to the gravitational force, so that patterns formed on the thin film transistor unit cell 30 or on the color filter unit cell 100 are damaged and electrically shorted. This problem may be solved when the first mother substrate 10 and the second mother substrate 80 are erected and transferred. When the first mother substrate 10 and the second mother substrate 80 are erected and transferred, the sagging phenomenon of the first mother substrate 10 and the second mother substrate 80 may be minimized.

Further, when the first mother substrate 10 and the second mother substrate 80 are erected and transferred, the air that flows from a ceiling of a clean room toward a bottom of the clean room makes a minimal contact with the first mother substrate 10 and the second mother substrate 80. Therefore, a contamination of the first mother substrate 10 and the second mother substrate 80 is minimized when the first mother substrate 10 and the second mother substrate 80 are erected and transferred.

Moreover, in most of equipments for manufacturing a liquid crystal display device, a substrate is erected and loaded into the equipments, and then the substrate is laid down to be disposed perpendicular to the gravitational force direction before the substrate undergoes any process in the equipments. Therefore, additional time for erecting the substrate so as to load the substrate into the equipment is not necessary when the substrate is transferred in an erected state.

Hereinafter, a non-contact aligning method and a device for aligning the liquid crystal molecules are disclosed.

First Embodiment of a Non-Contact Type Alignment of Liquid Crystal Molecules

In order to align liquid crystal molecules on the thin film transistor unit cell 30 of FIG. 2 or on the color filter unit cell 100 of FIG. 5, an alignment film and an atomic beam to be applied to the alignment film are needed.

Figure 7:
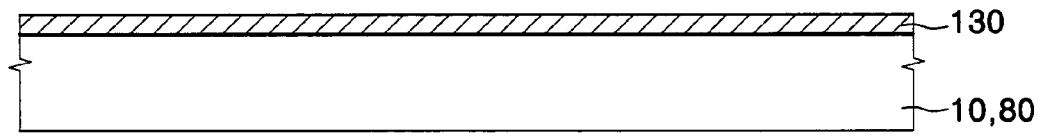
FIG. 7 is a cross-sectional view showing an alignment film formed on the first mother substrate or the second mother substrate according to the first exemplary embodiment.

FIG. 7 is a cross-sectional view showing an alignment film formed on the first mother substrate or the second mother substrate according to the first exemplary embodiment.

Referring to FIG. 7, an alignment film 130 includes a diamond-like-carbon thin film (DLC film) formed on surfaces of the thin film transistor unit cell and on the color filter unit cell. The alignment film 130 may include $SiO_2$, $Si_3N_4$ and $TiO_2$ aside from the diamond-like-carbon thin film.

Hereinafter, the diamond-like-carbon thin film is referenced by the reference numeral 130.

The diamond-like-carbon thin film 130 is used as an alignment film because the diamond-like-carbon thin film 130 has a carbon-carbon double bond When the carbon-carbon double bond of carbon atoms is broken into a carbon-carbon single bond, the carbon atoms have a polarity to become radicals.

When liquid crystal molecules are disposed on the diamond-like-carbon thin film 130 including carbon radicals, the liquid crystal molecule is self-aligned due to the diamond-like-carbon thin film 130 including the carbon radicals because the liquid crystal molecule has both characteristics of crystal and liquid and has a liquid crystal molecular director that aligns in accordance with external electromagnetic field.

In the present embodiment, an atomic beam induces the carbon radicals on the surface of the diamond-like-carbon thin film 130. A pre-tilt angle affects the viewing angle of the liquid crystal display device. When the pre-tilt angle of the liquid crystal molecules in a first region of a liquid crystal display panel is different from that of the liquid crystal molecules in a second region of the liquid crystal display panel, spots are shown on the liquid crystal display panel, so that the liquid crystal display device displays an inferior image.

In case the atomic beam induces the carbon radicals on the diamond-like-carbon thin film 130, when an angle between the atomic beam and a surface of the diamond-like-carbon thin film 130 vary according as, the pre-tilt angle of the liquid crystal molecules changes. Therefore, irradiation angle (or scanning angle) of atomic beam is related with display quality.

Figure 8:
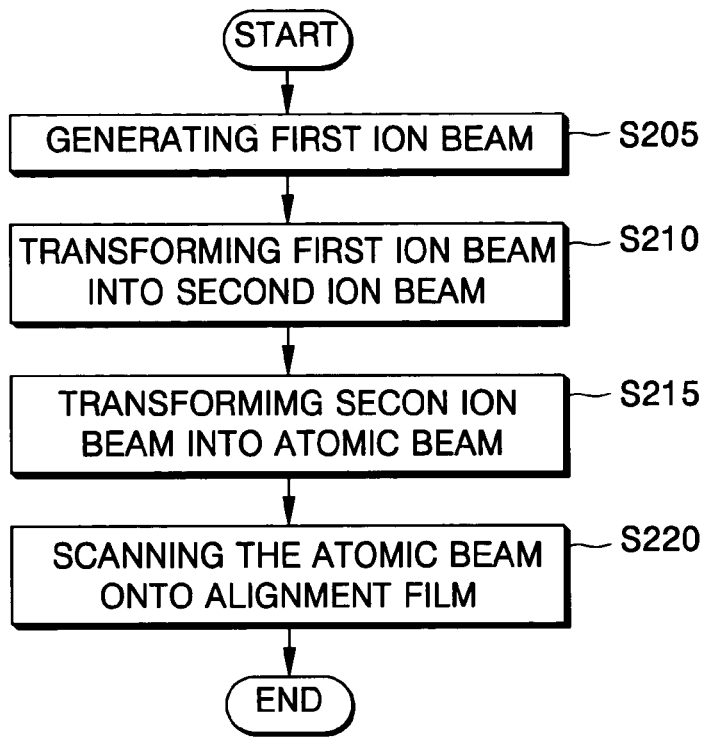
FIG. 8 is a flow chart showing a method of aligning liquid crystal on an alignment film by a non-contact method according to the first exemplary embodiment of the present invention.

FIG. 8 is a flow chart showing a method of aligning liquid crystal on an alignment film by a non-contact method according to the first exemplary embodiment of the present invention.

Referring to FIG. 8, in order to align liquid crystal molecules on a diamond-like-carbon thin film by a non-contact alignment method, a first ion beam is generated (step S205).

Figure 9:
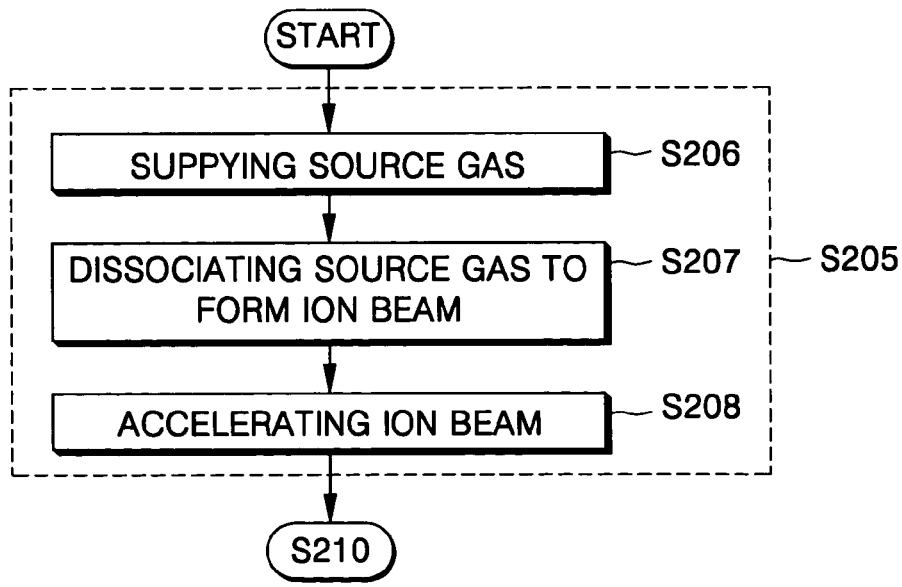
FIG. 9 is a flow chart showing a method of generating a first ion beam of FIG. 8.

FIG. 9 is a flow chart showing a method of generating a first ion beam of FIG. 8.

Referring to FIG. 9, in order to generate a first ion beam, a source gas is supplied (step S206) and the source gas is dissociated to be ions (step S207). Then, the ions are accelerated (step S208).

For example, an argon (Ar) gas is used as a source gas. The argon gas may be dissociated into argon ions by plasma-generating electric field or at a high temperature higher than about 2500K.

In the present embodiment, the argon gas is dissociated at a temperature higher than about 2500K.

When the source gas is dissociated and is transformed into ions, the ions of the source gas are accelerated toward the target (step S208). When a voltage having an opposite polarity to the polarity of the ions is applied to the target, the ions of the source gas are accelerated.

For example, the argon ions have a positive (+) polarity and a negative (−) voltage that is applied to the diamond-like-carbon thin film so as to accelerate the argon ions.

The argon ions are attracted toward the diamond-like-carbon thin film having a negative (−) voltage in accordance with Coulomb's Law. As an absolute value of the voltage applied to the diamond-like-carbon thin film becomes larger, an acceleration of the ions becomes faster.

When the first ion beam passes through an aperture of an ion beam generating device, an irradiation angle of the ion beam formed with a respect to a surface of the diamond-like-carbon thin film is controlled. A shape of the cross-section of the second ion beam depends on a shape of the aperture of the ion beam-generating device.

However, when the first ion beam is directly applied to the diamond-like-carbon thin film, it is hard to control an irradiation angle of the first ion beam with a respect to the diamond-like-carbon thin film.

Therefore, the first ion beam is transformed into a second ion beam (step S210) as shown in FIG. 8.

The first ion beam is transformed into the second ion beam by an electronic method or by a physical method. The second ion beam has a band shape that has a rectangular cross-section.

In order to generate the second ion beam having the above shape, the first ion beam is allowed to pass through a housing of which an entrance is broad and of which an outlet has a rectangular shape.

The angle of the second ion beam with a respect to the surface of the diamond-like-carbon thin film determines the pre-tilt angle of the liquid crystal molecules. The angle of the second ion beam with a respect to the surface of the diamond-like-carbon thin film is in a range from about 0° to about 90°. For example, when the liquid crystal is twisted nematic liquid crystal, the angle of the second ion beam with a respect to the surface of the diamond-like-carbon thin film is in the range from about 0° to about 45°. When the liquid crystal is vertically aligned in a vertical alignment mode, the angle of the second ion beam with a respect to the surface of the diamond-like-carbon thin film is in the range from about 45° to about 90°, preferably in the range from about 80° to about 90°.

Referring again to FIG. 8, the second ion beam advancing toward the diamond-like-carbon thin film 130 is transformed into an atomic beam (step S215). Both Direction and speed of the atomic beam are substantially the same as in the second ion beam.

Electrons are supplied to the second ion beam so that ions of the second ion beam are transformed into the source gas that is electrically neutral. The ions of the second ion beam are very unstable. Therefore, the ions accept electron to be transformed into an atomic beam that is electrically neutral and stable.

The atomic beam whose cross-section is rectangular is irradiated onto the diamond-like-carbon thin film since the atomic beam maintains the same shape as the second ion beam. Therefore, the atomic beam is scanned on the diamond-like-carbon thin film in order to be irradiated to the entire diamond-like-carbon thin film 130 (step S220).

In order to scan the atomic beam on the diamond-like-carbon thin film 130, the atomic beam may move while the position of the diamond-like-carbon thin film is stationary, or the diamond-like-carbon thin film may be moved while the beam source position of the atomic beam is stationary.

In the exemplary embodiments of the present invention, the atomic beam moves while the position of the diamond-like-carbon thin film is stationary.

Figure 10:
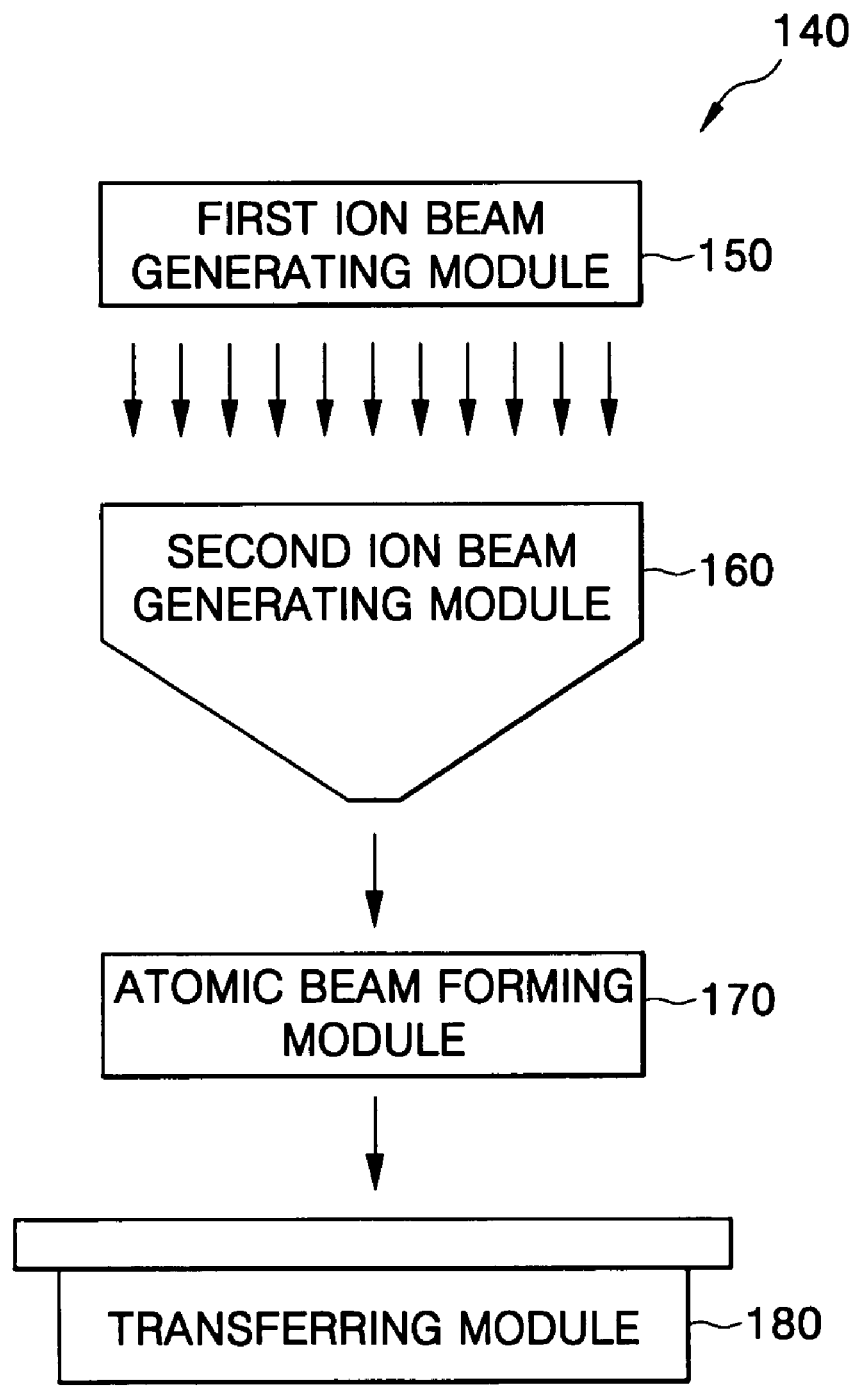
FIG. 10 is a schematic diagram showing a non-contact alignment device according to the first exemplary embodiment.
Figure 11:
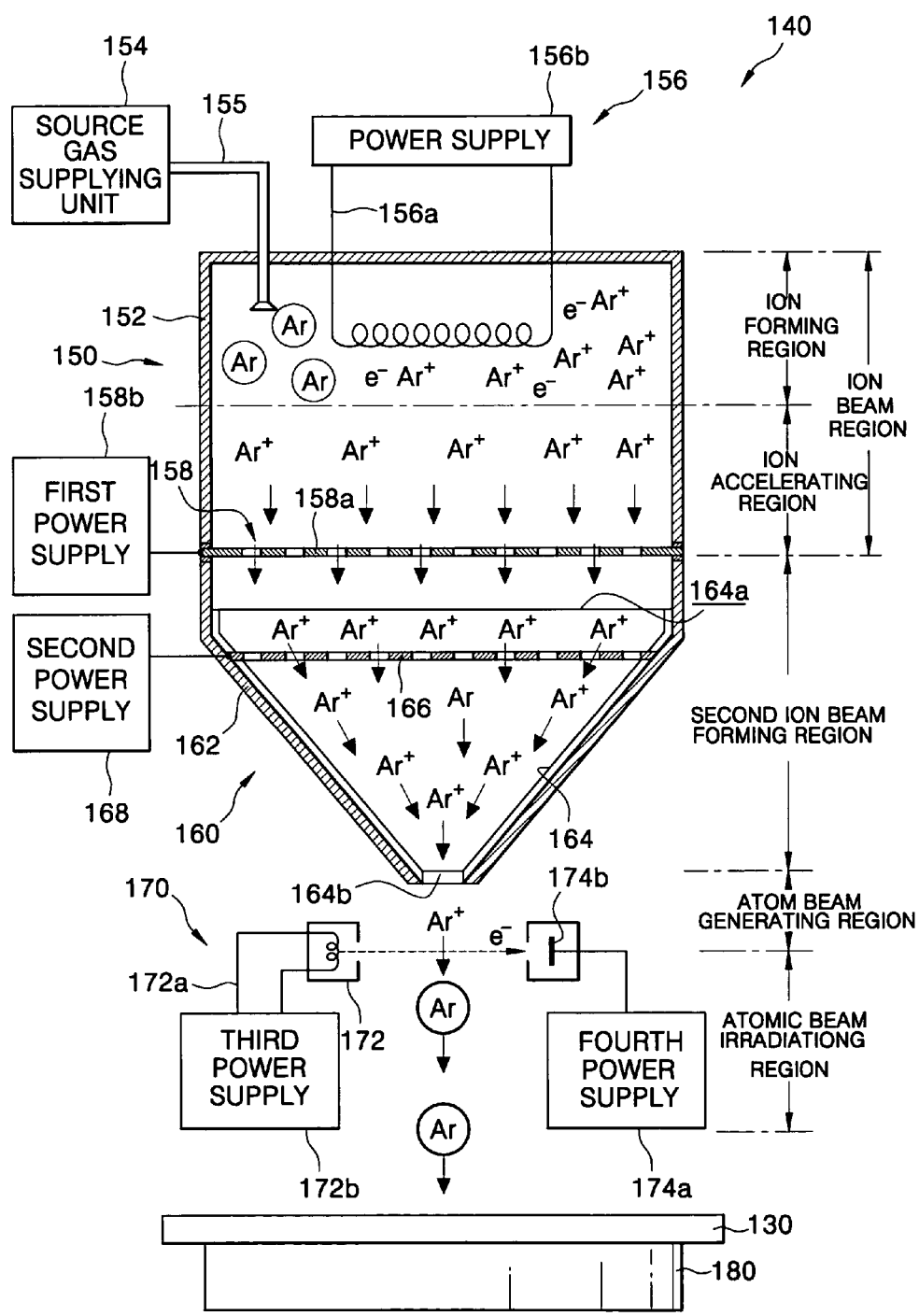
FIG. 11 is a schematic view showing a first ion beam generating module, a second ion beam generating module and an atomic beam generating module of FIG. 10.

FIG. 10 is a schematic view showing a non-contact alignment device according to the first exemplary embodiment, and FIG. 11 is a schematic view showing a first ion beam generating a module, a second ion beam generating a module and an atomic beam generating a module of FIG. 10.

Referring to FIG. 10, a non-contact alignment apparatus for aligning liquid crystal molecules includes a first ion beam generating module 150, a second beam generating module 160, an atomic beam generating module 170 and a transfer module 180.

Referring to FIG. 11, the first ion beam generating module 150 includes a first ion beam housing 152, a source gas supplying unit 154, a source gas dissociation unit 156 and an ion acceleration unit 158.

The first ion beam housing 152 provides a space in which a first ion beam is generated. The space is isolated from outside. The first ion beam housing 152 includes an ion generation region and an ion acceleration region.

The ion generating region of the first ion beam housing 152 is connected with the source gas supplying unit 154. The source gas supplying unit 154 provides the first ion beam housing 152 with argon (Ar) gas via a pipe 155. The argon has a heavy atomic weight. Therefore, the argon easily breaks the carbon-carbon double bond when the argon is accelerated.

The source gas dissociation unit 156 dissociates the argon gas supplied from the source gas supplying unit 154. The source gas dissociation unit 156 may have various elements.

For example, the source gas dissociation unit 156 may include a cathode electrode, an anode electrode and a power supply for applying power to the cathode electrode and the anode electrode.

The power supply applies a predetermined voltage to the cathode electrode and the anode electrode so that the argon gas is dissociated to argon ions and electrons.

The source gas dissociation unit 156 may include a tungsten (W) filament 156*a* that emits electrons, and a power supply 156*b* for heating the tungsten filament 156*a*.

The tungsten filament 156*a* emits electrons when the tungsten filament 156*a* is heated at a temperature higher than about 2500K. The electrons emitted from the tungsten filament 156*a* collide with the argon atom, so that the argon atom is transformed into an argon ion. The ion acceleration unit 158 is installed in the ion acceleration region of the first ion beam housing 152. The ion acceleration unit 158 accelerates the argon ions to have enough speed for the argon ions to break the carbon-carbon double bond of the diamond-like-carbon thin film.

The ion acceleration unit 158 includes an ion acceleration electrode 158a and a first power supply 158b. The ion acceleration electrode 158a has a mesh structure. The first power supply 158b applies voltage having a polarity that is opposite to that of the ions so as to accelerate the ions toward the ion acceleration electrode 158a.

For example, when the ions having a positive polarity is generated in the first ion beam housing 152 by the source gas dissociation unit 156, the first power supply 158b applies a negative voltage to the ion acceleration electrode 158a. Then, coulomb force accelerates the ions having a positive polarity toward the ion acceleration electrode 158a.

The speed of the ions is adjusted in accordance with a magnitude of the voltage applied to the ion acceleration electrode 158a.

When the voltage is too high, the ions has so much energy that the atomic beam penetrates the surface of the diamond-like-carbon thin film and to be implanted into the diamond-like-carbon thin film. When the voltage is too low, the ions may not have enough energy so that the atomic beam does not break the carbon-carbon double bond of the diamond-like-carbon thin film. Therefore, the voltage has a proper level such that the atomic beam is not implanted into the diamond-like-carbon thin film and does not break the carbon-carbon double bond of the diamond-like-carbon thin.

As described above, the first ion beam that is generated from the first ion beam generating module 150 is accelerated by the ion acceleration electrode 158a, and advances toward the second ion beam generating module 160.

The second ion beam generating module 160 includes a second ion beam housing 162, a second ion beam generating body 164, a first ion beam acceleration device 166 and a second power supply 168.

The second housing 162 includes a non-conducting material to be electrically insulated from the first ion beam housing 152. The second ion beam generating body 164 is installed on the second ion beam housing 162. The second ion beam generating body 164 includes a first ion beam inlet 164a through which the first ion beam enters and an second ion beam outlet 164b through which the second ion beam exits.

The first ion beam inlet 164a is large so that the first ion beam easily enters the second ion beam generating module 160. The first ion beam inlet 164 may have various shapes. The first ion beam acceleration device 166 is installed at the first ion beam inlet 164a. The first ion beam acceleration device 166 includes a conductive material. The second power supply 168 provides the first ion beam acceleration device 166 with a power voltage opposite to the polarity of the first ion beam. The first ion beam acceleration device 166 disposed at the first ion beam inlet 164a accelerates the first ion beam again.

The second ion beam outlet 164b has a rectangular shape. A width of the second ion beam outlet 164b is narrow, and a length of the second ion beam outlet 164b is long. The first ion beam enters the first ion beam inlet 164a and arrives at the second ion beam outlet 164b. The cross-section of the first ion beam has a rectangular figure when the first ion beam passes through the second ion beam outlet 164b. The second ion beam exits from the second ion beam outlet 164b.

An atomic beam generating module 170 is installed in an atomic beam generating region. In detail, the atomic beam generating module 170 is installed adjacent to the second ion beam housing 162. The atomic beam generating module 170 includes an electron generating unit 172 and an electron accelerating unit 174. The electron generating unit 172 generates electrons. The electron accelerating unit 174 moves the electron.

The electron generating unit 172 includes a tungsten filament 172a and a third power supply 172b. The third power supply 172b provides the tungsten filament 172a with a power voltage such that the tungsten filament 172a is heated and has temperature higher than about 2500 K, and electrons are emitted from the tungsten filament 172a.

The electron accelerating unit 174 faces the electron generating unit 172. The electron accelerating unit 174 attracts the electrons generated from the electron generating unit 172 by coulomb force.

The electron accelerating unit 174 includes a fourth power supply 174a and an electrode 174b. The fourth power supply 174a applies a positive (+) voltage opposite to the polarity of the electron to the electrode 174b.

The electron generated from the electron generating unit 172 moves toward the electron accelerating unit 174. A path of the electron intersects a path of the second ion beam. The ions of the second ion beam combine with the electrons generated from the electron generating unit 172. Therefore, the argon ion is transformed into an argon atom (Ar) such that an argon atomic beam is generated. The argon ions of the second ion beam have substantially the same speed as that of the argon atoms of the argon atomic beam, and the second ion beam moves in the same direction as in the argon atomic beam. Hereinafter, the source gas that moves at the same speed and direction as those of the second ion beam is referred to as an atomic beam.

The atomic beam generated from the atomic beam generating module 170 has a rectangular cross-section and is irradiated onto a portion of the diamond-like-carbon thin film. In order that the atomic beam is irradiated onto the entire diamond-like-carbon thin film, the atomic beam moves while the diamond-like-carbon thin film is fixed, or the diamond-like-carbon thin film is transferred while the atomic beam is fixed.

The transfer module 180 moves the substrate 130 or a combined body including the first ion beam generating module 150, the second ion beam generating module 160 and the atomic beam generating module 170 alternatively.

In the non-contacting alignment device 140 described above, which aligns the liquid crystal molecules by a non-contact alignment method, the atomic beam forms an angle in the range from about 0° to about 90° with a respect to the diamond-like-carbon thin film.

When the liquid crystal is twist nematic liquid crystal, the atomic beam forms an angle in the range from about 0° to about 45°.

When the liquid crystal is vertically aligned in the vertical alignment mode, the atomic beam forms an angle in the range from about 45° to about 90°, preferably, in the range from about 80° to about 90°.

The non-contact alignment device 140 may have at least two second ion beam outlets 164b so as to provide at least two atomic beams. The non-contacting alignment device 140 may generate a plurality of atomic beams, each of which advances toward the diamond-like-carbon thin film and enters into the diamond-like-carbon thin film to form different angles with a respect to the diamond-like-carbon thin film. Therefore, the angle between the atomic beam and the diamond-like-carbon thin film may be changed.

Figure 12:
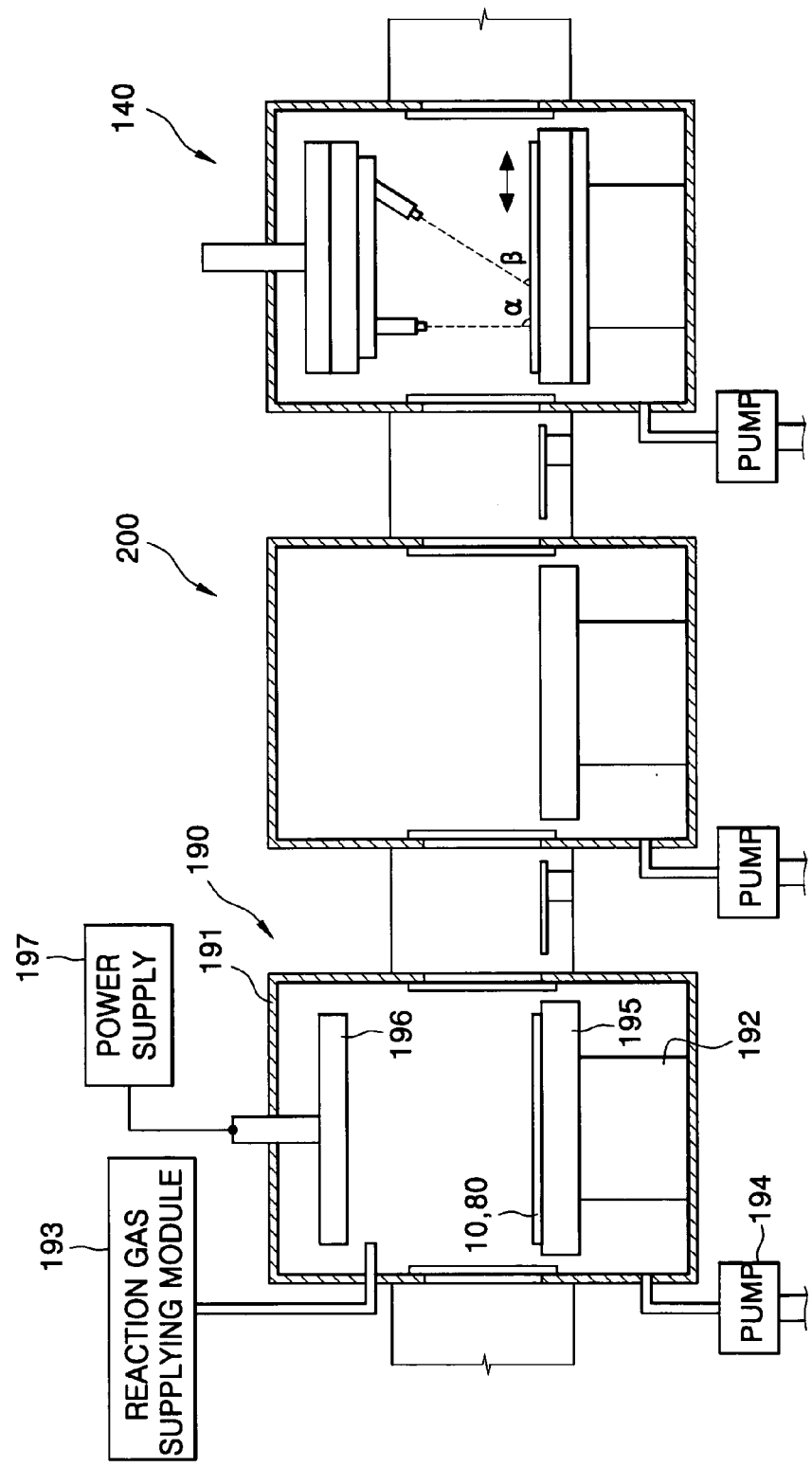
FIG. 12 is a schematic view showing a non-contact alignment device and a device for forming a diamond-like-carbon thin film.

As shown in FIG. 12, a device for forming the diamond-like-carbon thin film forms the diamond-like-carbon thin film on a mother substrate, and the mother substrate is transferred to the device for forming the diamond-like-carbon thin film, and the liquid crystal molecules are aligned by the non-contact alignment device 140. Namely, the diamond-like-carbon thin film and the liquid crystal molecules may be processed by an in-situ process. FIG. 12 is a schematic view showing a non-contact alignment device and a device for forming a diamond-like-carbon thin film.

The device 190 for forming the diamond-like-carbon thin film includes a chamber 191, a substrate supporting unit 192 for supporting a first mother substrate 10 or a second mother substrate 80, a reaction gas supplying module 193, a vacuum pump 194 and a plasma generator.

The substrate supporting unit 192 is disposed in the chamber 191. The first mother substrate 10 having the thin film transistor unit cell 30 of FIG. 2 is transferred and disposed on the substrate supporting unit 192. The second mother substrate 80 having the color filter unit cell 100 of FIG. 5 is transferred and disposed on the substrate supporting unit 192.

The reaction gas supplying module 193 may provide the chamber 191 with Helium (He), Hydrogen ($H_2$), Methane ($CH_4$) or Acetylene ($C_2H_2$).

The vacuum pump 194 provides the chamber 191 with a high-vacuum of about 60 Torr. Therefore, impurities or gas except for reaction gas may not be participated in a process of forming diamond-like-carbon thin film.

The plasma generator forms diamond-like-carbon thin film with reaction gas. The plasma generator includes a cathode electrode 195, an anode electrode 196 and a power supply 197. The high voltage is applied between the cathode electrode 195 and the anode electrode 196, so that the Helium or the Argon gas is ionized.

The device 190 for forming diamond-like-carbon thin film may be combined directly with the alignment device 140.

In contrast, a load lock chamber 200 may installed between the device 190 and the alignment device 140. The first mother substrate 10 or the second mother substrate 80 stands by temporarily in the load lock chamber 200.

When the device 190 for forming the diamond-like-carbon thin film, the load lock chamber 200 and the alignment device 140 are installed so that the diamond-like-carbon thin film and the liquid crystal molecules may be processed by a in-situ process, the time for aligning liquid crystal molecules is reduced. Further, contamination of the first mother substrate 10 and the second mother substrate 80 is reduced.

Second Embodiment of a Non-Contact Type Alignment of Liquid Crystal Molecules

Figure 13:
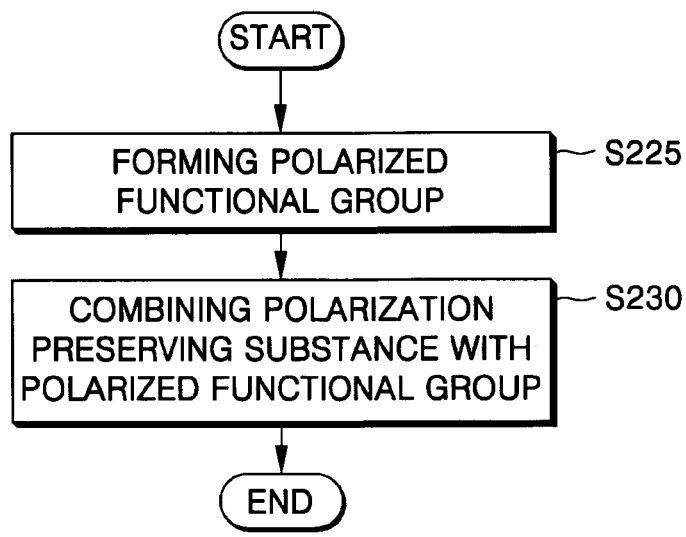
FIG. 13 is a flow chart showing a method of aligning liquid crystal by a non-contact method according to a second exemplary embodiment.

FIG. 13 is a flow chart showing a method of aligning liquid crystal by a non-contact method according to a second exemplary embodiment.

In previous procedure, the diamond-like-carbon thin film having a carbon-carbon double bond is formed on the first substrate 10 having the thin film transistor unit cell 30 of FIG. 2 or on the second substrate 80 having the color filter unit cell 100 of FIG. 5. The diamond-like-carbon thin film is formed via Chemical Vapor Deposition (CVD).

Referring to FIG. 13, the atomic beam collides with the diamond-like-carbon thin film, so that a polarized functional group for aligning liquid crystal molecules is generated (step S225).

Figure 14:
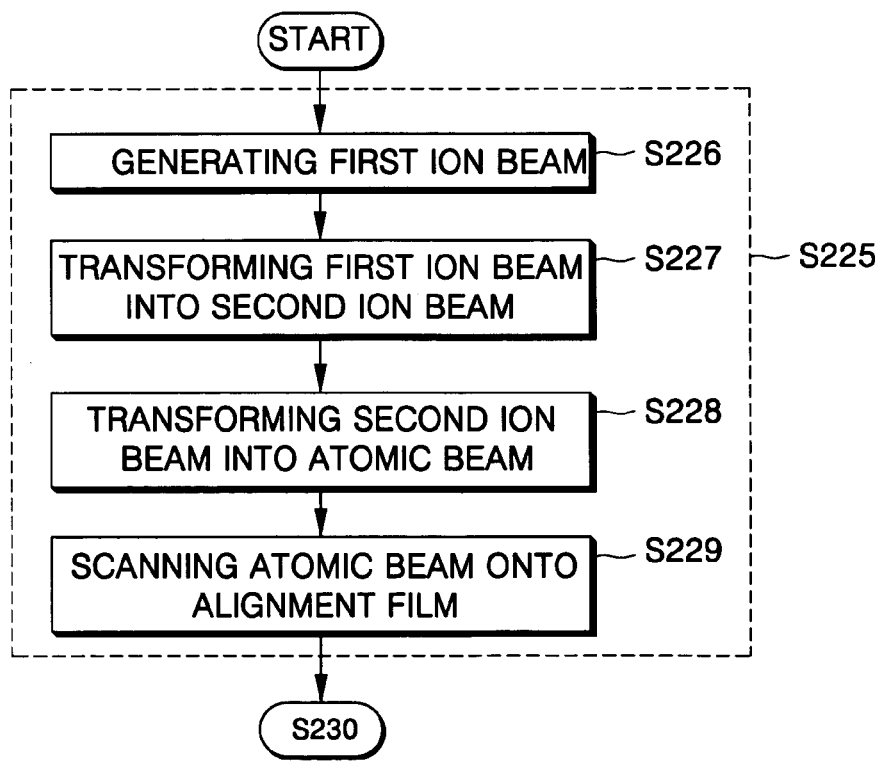
FIG. 14 is a flow chart showing a method of forming a polarized functional group in the diamond-like-carbon thin film according to the second exemplary embodiment.

FIG. 14 is a flow chart showing a method of generating a polarized functional group in the diamond-like-carbon thin film according to the second exemplary embodiment.

Referring to FIG. 14, a first ion beam is generated and accelerated toward the diamond-like-carbon thin film (step S226).

Then, the first ion beam is transformed into a second ion beam of which cross-section is square shaped (step S227). A speed of the second ion beam is similar to a speed of the first ion beam. The second ion beam forms an angle in the range from about 0° to about 90° with a respect to the diamond-like-carbon thin film.

When the second ion beam advances toward the diamond-like-carbon thin film, the second ion beam collides with electrons that intersect the second ion beam, so that the second ion beam is transformed into the an atomic beam (step S228). The speed and direction of the second ion is substantially preserved, because the mass of the ion is much larger than that of the electron. Therefore, the speed and the direction of the atomic beam are substantially equal to the speed and the direction of the second ion beam.

The atomic beam arrives at a surface of the diamond-like-carbon thin film and collides with the diamond-like-carbon thin film. The atomic beam scans the surface of the diamond-like-carbon thin film (step S229).

The atomic beam that collides with the diamond-like-carbon thin film changes the surface of the diamond-like-carbon thin film. In detail, the atomic beam breaks the carbon-carbon double bond to generate sub-chain that has a carbon-carbon single bond structure and a radical state. Namely, the radical formed in diamond-like-carbon thin film forms a polarized functional group for aligning liquid crystal molecules.

The polarized functional group is very unstable. Therefore, the polarized functional group tends to regenerate the carbon-carbon double bond structure.

When the stable carbon-carbon singlebond structure is restored to the unstable carbon-carbon double bond structure, the polarized functional group generated in the diamond-like-carbon thin film disappears.

When the polarized functional group for aligning liquid crystal molecule is not shown, the liquid crystal molecules may not maintain the pre-tilt angle, so that display quality of the liquid crystal display device is deteriorated.

Therefore, in order to maintain the display quality of the liquid crystal display device, the polarized functional group for aligning liquid crystal molecule should remain permanently on the diamond-like-carbon thin film.

Therefore, after the polarized functional group is generated, the polarization preserving substance is combined with the polarized functional group such that the polarized functional group exists permanently on the diamond-like-carbon thin film (step S230).

When the carbon-carbon double bond is broken, carbon-carbon single bond and sub-chain are generated. In order that the polarized functional group exists permanently, the sub-chain is combined with other functional group.

Figure 15:
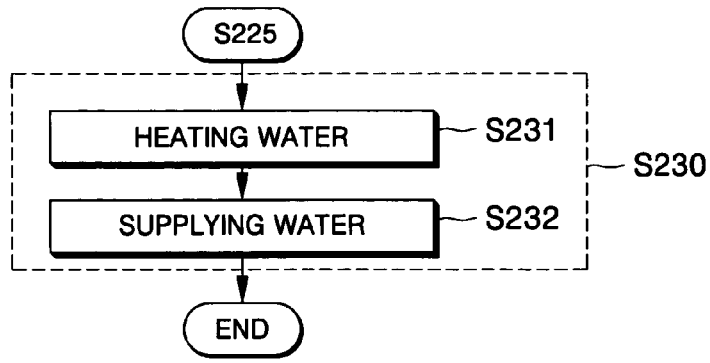
FIG. 15 is a flow chart showing a process of introducing a hydroxyl radical ($OH^-$) into the polarized functional group.

FIG. 15 is a flow chart showing a process of introducing a hydroxyl radical ($OH^-$) into the polarized functional group.

In order that the polarized functional group exists permanently, a sub-chain of the polarized functional group combines with hydroxyl radical (—OH), so that a C—OH bond is formed in the diamond-like-carbon thin film.

Firstly, deionized water (DI water) is heated into a vapor (step S231). The vapor is applied onto the surface of the diamond-like-carbon thin film (step S232).

Heating the deionized water to form the vapor is not essential but the deionized water that is vaporized activates the combination of the deionized water and the sub-chain.

When the hydroxyl radical (—OH) is combined with the sub-chain of the diamond-like-carbon thin film, the sub-chain may not be recombined with carbon. Therefore, the carbon atoms on the diamond-like-carbon thin film have carbon-carbon single bonds, so that the polarized functional group that is electrically unstable is maintained.

According to an embodiment described above, the polarized functional group that is combined with the hydroxyl radical (—OH) prevents the diamond-like-carbon thin film from being electrically neutralized.

Third Embodiment of a Non-Contact Type Alignment of Liquid Crystal Molecules

Figure 16:
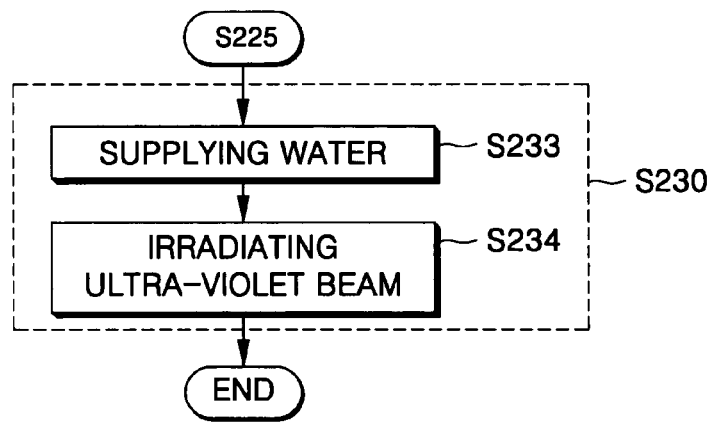
FIG. 16 is a flow chart showing a process of introducing a hydrogen ion into the polarized functional group according to a third exemplary embodiment of the present invention.

FIG. 16 is a flow chart showing a process of introducing a hydrogen ion into the polarized functional group according to a third exemplary embodiment of the present invention.

Deionized water is supplied to the surface of the diamond-like-carbon thin film in order that hydrogen ion ($H^+$) is combined with the sub-chain (step S233).

Then, ultra-violet ray is irradiated onto the surface of the diamond-like-carbon thin film in order that the hydrogen ion ($H^+$) is combined with the sub-chain (step S234).

When the ultra-violet ray is irradiated on the deionized water, two hydrogen ions and one oxygen ion are generated as shown in the following chemical formula.

$$H2O \rightarrow 2H^+ + O^{-2}$$ <chemical formula 1>

The hydrogen ion ($H^+$) dissociated by the ultra-violet ray is combined with the sub-chain to form a C—H bond.

When the hydrogen ion ($H^+$) is combined with the sub-chain formed in the diamond-like-carbon thin film in which the polarized functional group is formed, the sub-chain may not be recombined with a carbon atom. Therefore, the electrically unstable polarized functional group that is electrically unstable remains in the diamond-like-carbon thin film.

Bonding the hydrogen ion ($H^+$) with the sub-chain by the ultra-violet ray and the deionized water may be carried out at a low temperature.

In contrast, when the hydrogen gas passes through a region having temperature higher than about 2500K, protons ($H^+$) and electrons ($e^-$) are dissociated from the hydrogen gas. The protons ($H^+$) may be combined with the sub-chain to form the C—H bond.

Fourth Embodiment of a Non-Contact Type Alignment of liquid Crystal Molecules

Figure 17:
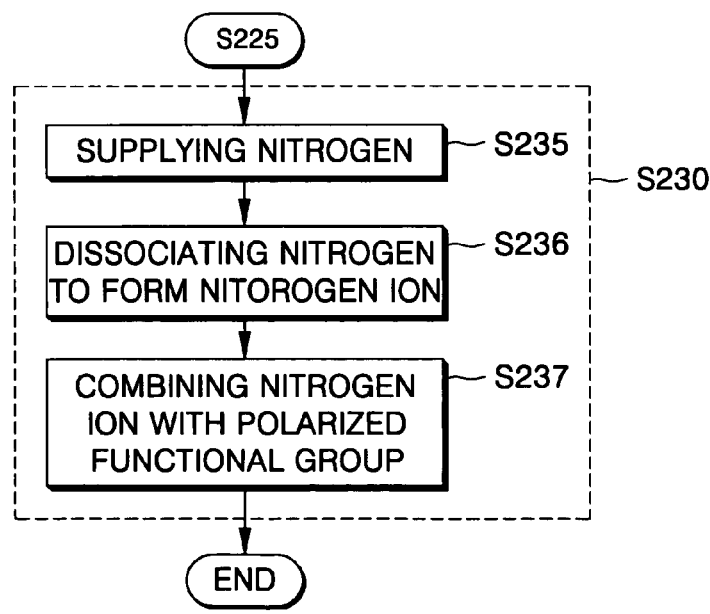
FIG. 17 is a flow chart showing a process of introducing a nitrogen ion into the polarized functional group according to a fourth exemplary embodiment of the present invention.

FIG. 17 is a flow chart showing a process of introducing a nitrogen ion into the polarized functional group according to a fourth exemplary embodiment of the present invention.

Nitrogen ion ($N^-$) is combined with the sub-chain formed in the diamond-like-carbon thin film by the atomic beam in order that the polarized functional group may remain on the diamond-like-carbon thin film.

Nitrogen gas ($N_2$) is provided (step S235) and the nitrogen gas is dissociated to form the nitrogen ion ($N^-$) (step S236). A voltage higher than the ionization voltage of the nitrogen is applied to the nitrogen gas ($N_2$), so that the nitrogen ion ($N^-$) is formed.

The nitrogen ion ($N^-$) is combined with the polarized functional group formed in the diamond-like-carbon thin film to form a C—N bond (step S237).

When the nitrogen ion ($N^-$) is combined with the sub-chain, the sub-chain may not be recombined with a carbon atom, and the carbon atoms maintain a carbon-carbon single bond. Therefore, the polarized functional group that is electrically unstable is maintained.

In above described first embodiment to third embodiment, the hydroxyl radical, the hydrogen ion or the nitrogen ion is combined with the polarized functional group so as to maintain the polarized functional group.

Hereinafter, a device for a non-contact alignment of liquid crystal according to the second exemplary embodiment of a non-contact aligning of liquid crystal molecule is shown.

Fifth Embodiment of a Non-Contact Alignment of Liquid Crystal Molecules

Figure 18:
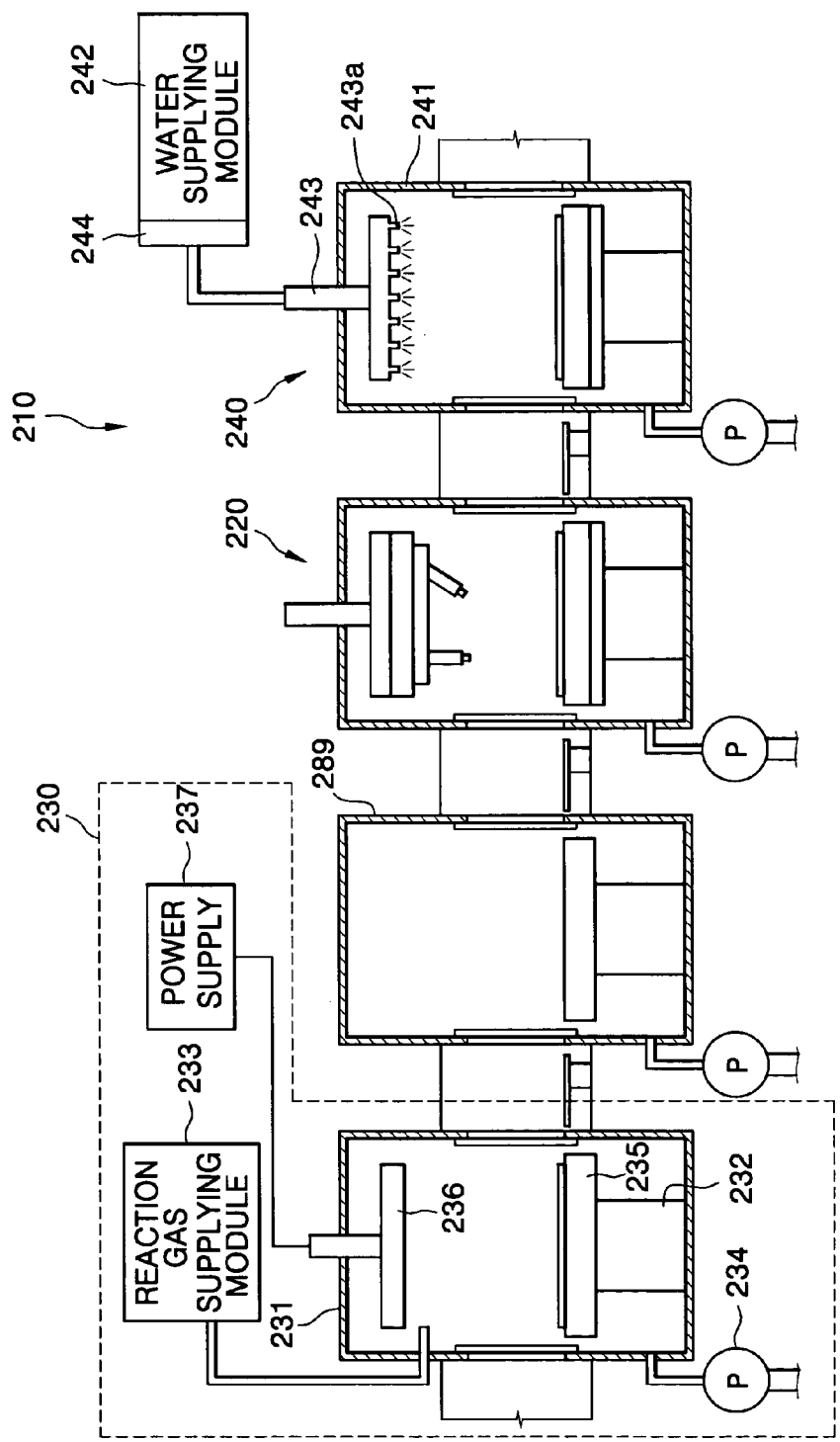
FIG. 18 is a schematic view showing a non-contact alignment device according to a fifth exemplary embodiment of the present invention.

FIG. 18 is a schematic view showing a non-contact alignment device according to a fifth exemplary embodiment of the present invention.

Referring to FIG. 18, a non-contact alignment device 210 for non-contacting aligning a liquid crystal molecule includes an atomic beam irradiating part 220 and a polarity maintaining part 240.

Further, the non-contact alignment device 210 may includes a thin film forming part 230 for a forming a diamond-like-carbon thin film on the first mother substrate 10 or on the second mother substrate 80.

Referring to FIG. 18, the thin film forming part 230 includes a chamber 231, a substrate supporting unit 232, a reaction gas supplying module 233, a vacuum pump 234 and a plasma generator having a cathode electrode 235, an anode electrode 236 and a power supply 237.

The substrate supporting unit 232 is disposed in the chamber 231. The first mother substrate 10 on which thin film transistor unit cells are formed, and the second mother substrate 80 on which color filter unit cells are formed are supported by the substrate supporting unit 232.

The reaction gas supplying module 233 supplies the chamber 231 with a reaction gas such as helium (He), argon (Ar), Hydrogen ($H_2$), methane ($CH_4$) or acetylene ($C_2H_2$).

The vacuum pump 234 generates a high vacuum that is about 60 Torr in the chamber 231, such that the other gas except for the reaction gas may not participate in the process for forming the diamond-like-carbon thin film.

The diamond-like-carbon thin film is formed with the reaction gas by the plasma generator.

The plasma generator includes the cathode electrode 235, the anode electrode 236 and the power supply 237. A sufficient voltage is applied between the cathode electrode 235 and the anode electrode 236, such that the helium (He) or argon (Ar) may be ionized.

The thin film forming part 230 may be directly combined with the atomic beam irradiating part 220.

However, a load lock chamber 289 may be interposed between the thin film forming part 230 and the atomic beam irradiating part 220. The first mother substrate 10 or the second mother substrate 80 stand by in the load lock chamber 289 as shown in FIG. 18.

When the thin film forming part 230, the load lock chamber 289, the atomic beam irradiating part 220 and the polarity maintaining part 240 are combined in series, a procedure for aligning a liquid crystal molecule needs reduced time and contamination of the first mother substrate 10 and the second mother substrate 80 is reduced.

The first mother substrate 10 or the second mother substrate 80 on which the diamond-like-carbon thin film is formed is transferred to the atomic beam irradiating part 220.

Atomic beam generated from the atomic beam irradiating part 220 collides with the diamond-like-carbon thin film formed on the first mother substrate 10 or the second mother substrate 80, and a carbon-carbon double bond is broken, so that a carbon-carbon single bond and sub-chain are formed in the diamond-like-carbon thin film. Therefore, the polarized functional group for aligning liquid crystal molecule is formed.

The polarity maintaining part 240 maintains the polarized functional group, such that the polarized functional group remains in the diamond-like-carbon thin film.

Hereinafter, various polarity maintaining parts 240 are disclosed.

Referring to FIG. 18, the polarity maintaining part 240 includes a chamber 241, a water supplying module 242 and a spraying module 243.

A process for maintaining polarized functional group is performed in the chamber 241.

The supplying module 243 supplies the chamber 241 with deionized water. The supplying module 243 may further includes a heating unit 244 for heating the deionized water to be transformed into vapor.

The spraying module 243 sprays the deionized water or the vapor onto the first mother substrate 10 or on the second mother substrate 80 uniformly. The spraying module 243 includes a spaying nozzle 243a.

Sixth Embodiment of a Non-Contact Type Alignment of Liquid Crystal Molecules

Figure 19:
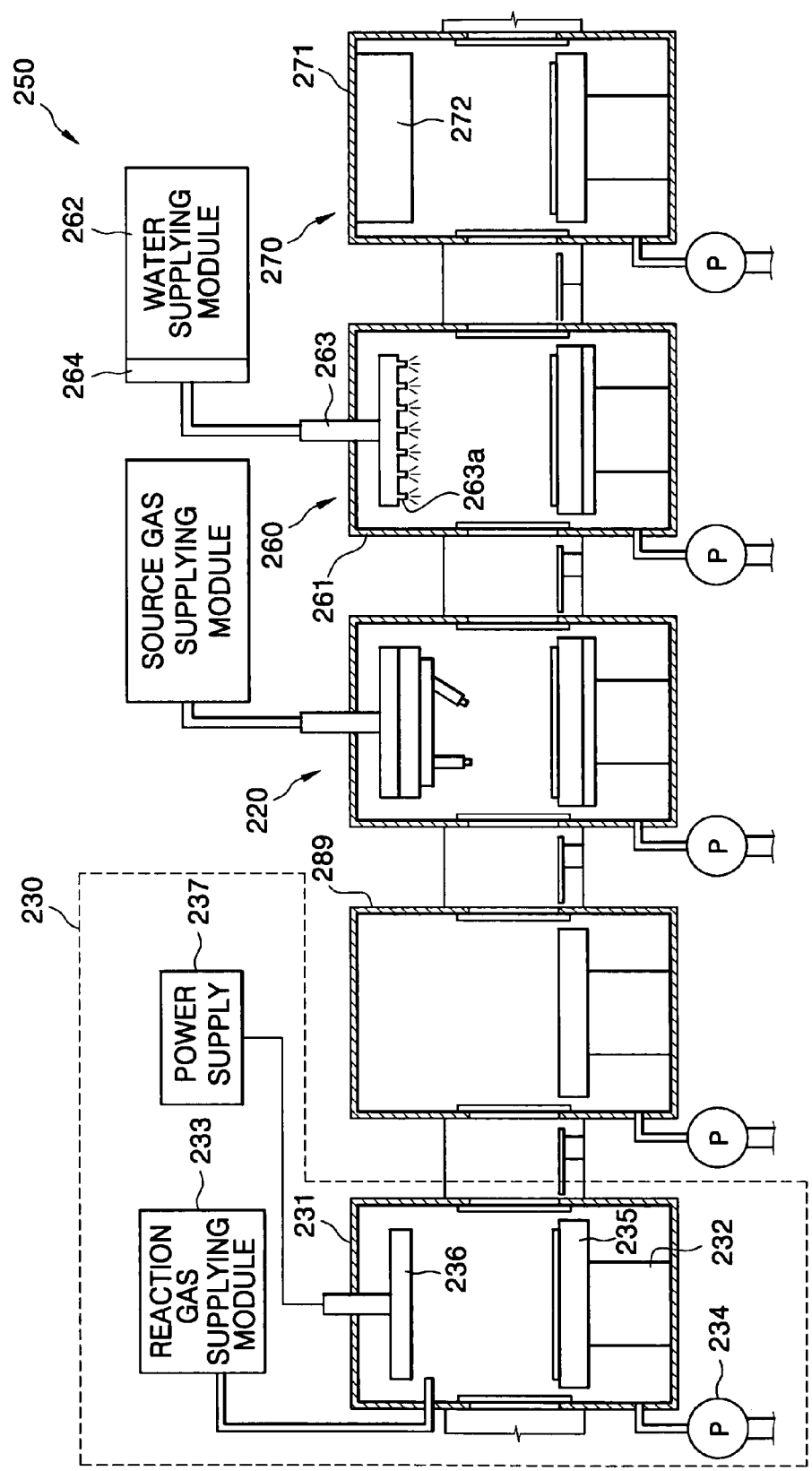
FIG. 19 is a schematic view showing a non-contact alignment device according to a sixth exemplary embodiment of the present invention.

FIG. 19 is a schematic view showing a non-contact alignment device according to a sixth exemplary embodiment of the present invention.

Referring to FIG. 19, the polarity maintaining part 250 includes a water supplying part 260 and a ultra-violet irradiating part 270.

The water supplying part 260 includes a chamber 261, a water supplying module 262 and a spraying module 263.

Water is sprayed on the diamond-like-carbon thin film in the chamber 261. The water supplying module 262 supplies the chamber 261 with the water. The spraying module 263 sprays the water or vapor on the first mother substrate 10 or on the second mother substrate 80 uniformly. The spaying module 263 includes a spraying nozzle 263a.

The ultra-violet irradiating part 270 includes a chamber 271 and a ultra-violet irradiating module 272. The ultra-violet irradiating module 272 irradiates ultra-violet beam onto the diamond-like-carbon thin film. The ultra-violet beam dissociates the water into a hydrogen ion ($H^+$) and an oxygen ion ($O^{2-}$). The hydrogen ion ($H^+$) is combined with the sub-chain formed in the diamond-like-carbon thin film.

The sub-chain is combined with the hydrogen ion ($H^+$). Therefore, the sub-chain may not recombine with carbon atom. Therefore, the polarized functional group is maintained.

The dissociation of the water into a hydrogen ion ($H^+$) and an oxygen ion ($O^{2-}$) may be performed at the room temperature.

A thin film forming part 230 and an atomic beam irradiating part 220 are the same as those disclosed in FIG. 18. Therefore, the description of the identical elements is omitted.

Seventh Embodiment of Non-contact Type Alignment of Liquid Crystal Molecules

Figure 20:
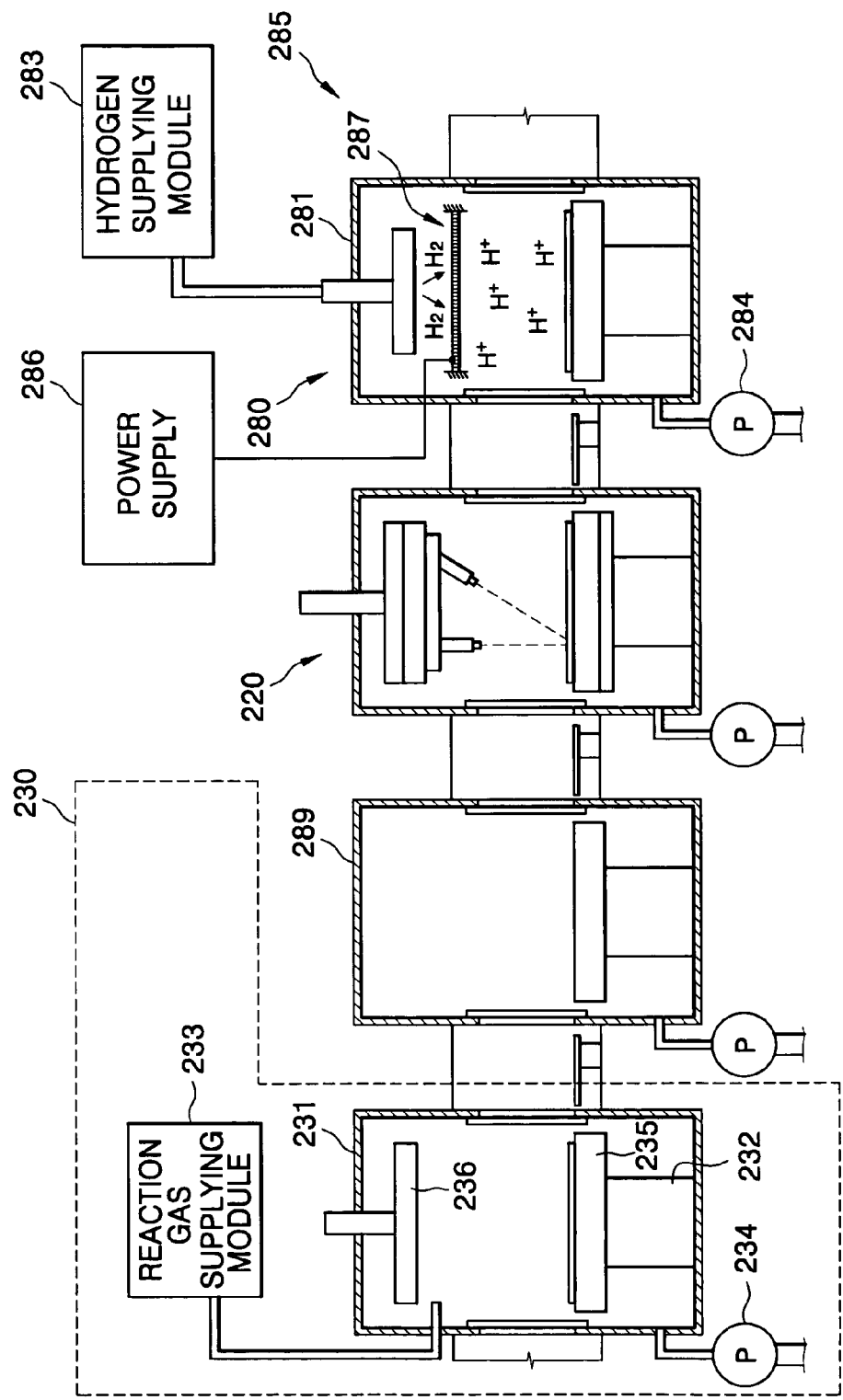
FIG. 20 is a schematic view showing a non-contact alignment device according to seventh exemplary embodiment of the present invention.

FIG. 20 is a schematic view showing a non-contact alignment device according to a seventh exemplary embodiment of the present invention.

Referring to FIG. 20, a polarity maintaining part 280 includes a chamber 281, a hydrogen supplying module 283, a hydrogen dissociation module 285.

A vacuum pump 284 maintains the low-pressure of about 60 Torr in the chamber 281, so that the other gases except for a reaction gas may not participate in the process for forming the diamond-like-carbon thin film.

In particular, material for maintaining polarized functional group is unstable material such as hydrogen, the pressure of the chamber 281 is maintained at a low pressure.

The hydrogen supplying module 283 supplies the chamber 281 with a predetermined amount of hydrogen gas.

The hydrogen dissociation module 285 transforms the hydrogen gas into a hydrogen ion.

The hydrogen dissociation module 285 includes a heater 287 and a power supply 286. The heater 287 heats the hydrogen gas, such that a temperature of the hydrogen gas is higher than about 2500K. The power supply 286 supplies the heater 287 with power.

The heater 287 includes tungsten (W), and the heater 287 has a mesh-shape.

When the hydrogen gas is heated, such that the temperature of the hydrogen gas is higher than about 2500K, the hydrogen gas is dissociated into hydrogen ions and electrons.

The hydrogen ions are combined with a sub-chain formed in the diamond-like-carbon thin film, so that C—H bond is formed.

When the hydrogen ions are combined with the sub-chain, the sub-chain may not be recombined with carbon atoms, so that the polarized functional group is maintained.

A thin film forming part 230 and an atomic beam irradiating part 220 are identical element disclosed in FIG. 18. Therefore, the description of the identical elements is omitted.

Figure 21:
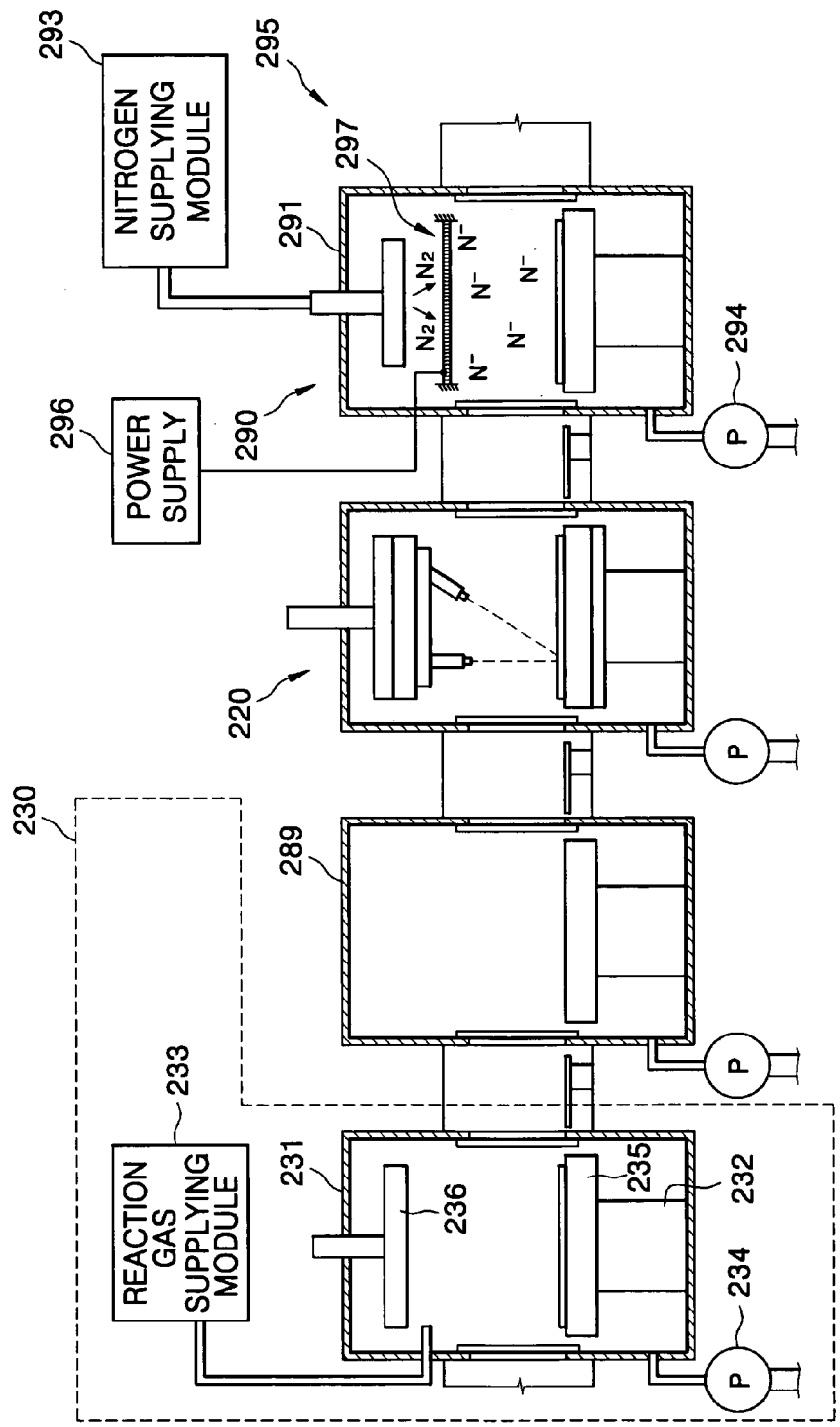
FIG. 21 is a schematic view showing a non-contact alignment device according to a eighth exemplary embodiment of the present invention.

Eighth Embodiment of Non-Contact Type Alignment of Liquid LIQUID Crystal Molecules FIG. 21 is a schematic view showing a non-contact alignment device according to a eighth exemplary embodiment of the present invention.

Referring to FIG. 21, a polarity maintaining part 290 includes a chamber 291, a nitrogen supplying module 293 and a nitrogen dissociation module 295.

Vacuum pump 294 maintains a low-pressure in the chamber 281, so that the other gases except for a reaction gas may not participate in the process for forming the diamond-like-carbon thin film.

The nitrogen supplying module 293 supplies the chamber 291 with a predetermined amount of nitrogen gas.

The nitrogen dissociation module 295 transforms the nitrogen gas into a nitrogen ion.

The nitrogen dissociation module 295 includes a heater 297 and a power supply 296. The heater 297 heats the nitrogen gas, such that a temperature of the nitrogen gas is higher than about 2500K. The power supply 296 supplies the heater 297 with power.

The heater 297 includes tungsten (W), and the heater 297 has a mesh-shape.

When the nitrogen gas is heated, such that the temperature of the nitrogen gas is higher than about 2500K, the nitrogen gas is dissociated into nitrogen ions and electrons.

The nitrogen ions are combined with a sub-chain formed in the diamond-like-carbon thin film, so that a C—N bond is formed.

When the nitrogen ions are combined with the sub-chain, the sub-chain may not be recombined with carbon atoms, so that the polarized functional group is maintained. A thin film forming part 230 and an atomic beam irradiating part 220 are identical element disclosed in FIG. 18. Therefore, the description of the identical elements is omitted.

In the above-described <First embodiment of a non-contact type alignment of liquid crystal molecules> to <Eighth embodiment of a non-contact type alignment of liquid crystal molecules>, the atomic beam forms the polarized functional group in the diamond-like-carbon thin film, for aligning liquid crystal molecule.

A direction of the atomic beam and a cross-sectional shape of the atomic beam are important, because the direction and the cross-sectional shape influence a pre-tilt angle of the liquid crystal molecule.

Ninth Emmbodiment of Non-Contact Type Alignment of Liquid Crystal Molecules

Figure 22:
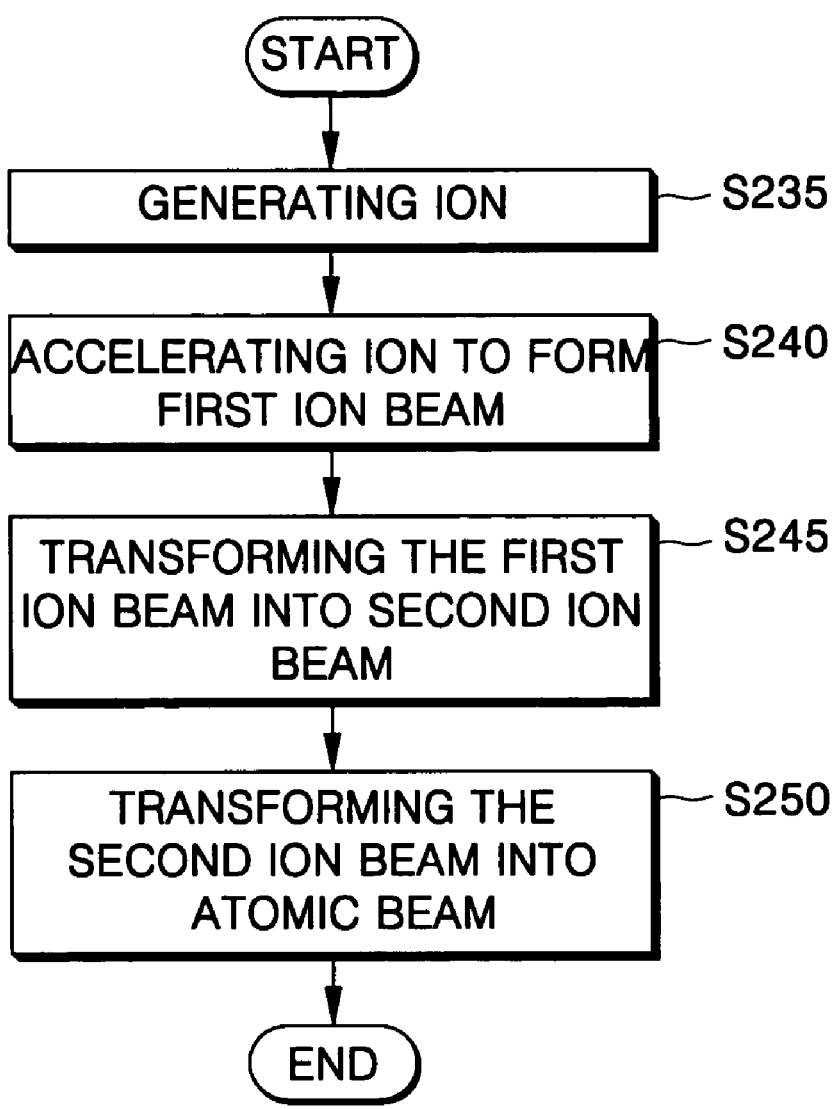
FIG. 22 is a flow chart showing a method for generating an atomic beam according to a ninth exemplary embodiment of the present invention.

FIG. 22 is a flow chart showing a method for generating an atomic beam according to a ninth exemplary embodiment of the present invention.

Referring to FIG. 22, firstly an ion is formed (step S235). A source gas is dissociated to form the ion. Argon (Ar) gas may be used for the source gas. The argon gas is one of the inert gases that have a low chemical activity and that may not be included in any chemical compound, and the argon gas is heavy, so that the argon gas may apply a large impact on the carbon-carbon double bond and on the breaking the carbon-carbon double bond.

In order to obtain the ion from the source gas, two methods are used.

Firstly, when a voltage is applied to the source gas, the source gas is dissociated into ions, electrons and a neutron. Secondly, when the source gas is heated, such that the temperature of the source gas is higher than 2500K, the source gas is dissociated, and ions are formed.

When the ions are formed, the ions are accelerated to form a first ion beam (step S240). A first electrode has an opposite polarity to the polarity of the ions, and the first electrode attracts the ions, so that the ions are accelerated.

Then the ion beam is transformed into a second ion beam of which cross-section has a rectangular or circular shape (step S245).

The shape of the cross-section of the second ion beam influences the alignment quality of liquid crystal molecules.

The cross-section of the second ion beam may have a rectangular shape. A width of the rectangular second ion beam determines an interval of the aligned liquid crystal molecules. The smaller the width is, the smaller is the interval.

The first ion beam is focused to form the second ion beam. The first ion beam is a flow of ions, not a flow of photons. Light, as a flow of the photons, may be focused by lens, but the first ion beam may not be focused by lens because the progress of the first ion beam may be interrupted by the lens. A housing focuses the first ion beam. An area of an inlet of the housing is large, but an area of an outlet of the housing is small and rectangular shaped. Therefore, when the ion beam passes through the housing, the first ion beam is focused. A second electrode that has a polarity opposite to the polarity of the first ion beam is formed adjacent to the outlet, so that the first ion beam is accelerated.

After the second ion beam is formed, electrons are combined with the second ion beam so that the atomic beam is formed (step S250). Electrons intersect the second ion beam, such that electrons are combined with the second ion beam.

The atomic beam may be used in various fields. For example, atomic beam that is electrically neutral is injected into a thin film to change characteristics of the thin film, or the atomic beam is used for maintaining a pre-tilt angle of the liquid crystal molecule.

Tenth Embodiment of Non-Contact Type Alignment of liquid Crstal Molecules

Figure 23:
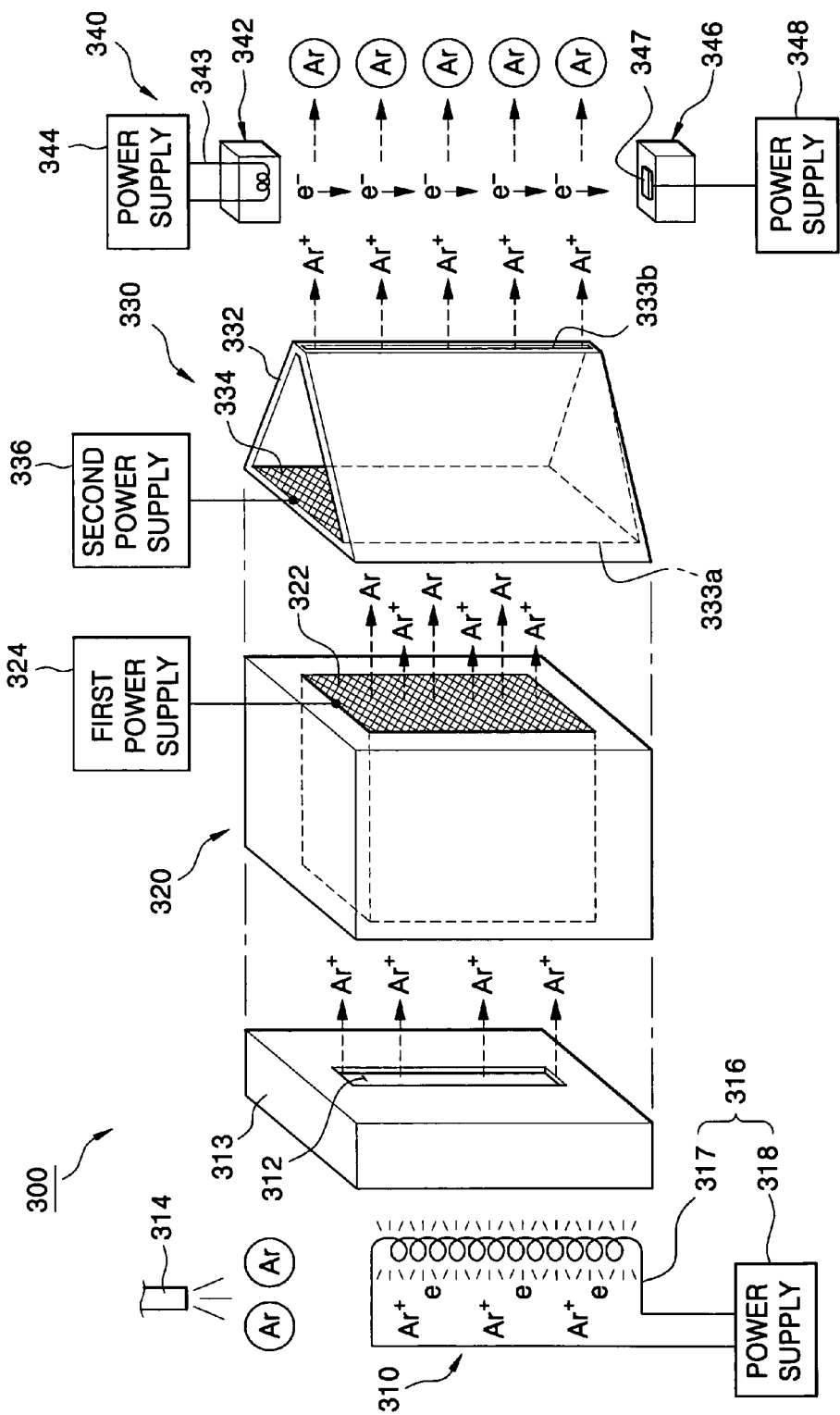
FIG. 23 is a schematic view showing an atomic beam generating device according to a tenth exemplary embodiment of the present invention.

FIG. 23 is a schematic view showing an atomic beam generating device according to a tenth exemplary embodiment of the present invention.

Referring to FIG. 23, an atomic beam generating device 300 includes an ion generating part 310, a first ion beam generating part 320, a second ion beam generating part 330 and an atomic beam generating part 340.

The ion generating part 310 includes a chamber 312, a source gas supplying unit 314 and a source gas dissociation unit 316.

The chamber 312 provides a space in which ions are formed. The chamber 312 has an opening 313. The ions formed in the chamber 312 flows out through the opening 313.

The opening 313 may have a circular shape or a rectangular shape that has a width and a length. The length is larger than the width.

The source gas supplying unit 314 and the source gas dissociation unit 316 are formed in the chamber 312.

The source gas supplying unit 314 supplies the chamber 312 with argon (Ar) gas. The argon gas is one of the inert gases which have low chemical activity and which may not be included in any chemical compound. Further, the argon gas is heavy. Thus, the argon gas is proper to impact on the carbon-carbon double bond formed between two carbon atoms so as to break the carbon-carbon double bond.

The source gas dissociation unit 316 dissociates the argon gas.

The source gas dissociation unit 316 may include a cathode electrode, an anode electrode and a power supply 318.

The source gas dissociation unit 316 may include a tungsten filament 317 for heating the source gas such as argon gas, and a power supply for supplying the tungsten filament 317 with power voltage. The source gas dissociation unit 316 heats the source gas, such that temperature of the argon gas becomes higher than about 2500K. When the source gas is heated, so that the temperature of the source gas becomes higher than about 2500K, the source gas is dissociated into ions.

The first ion beam generating part 320 accelerates the ions. The first ion beam generating part 320 includes a first electrode 322 and a first power supply 324 for supplying the first electrode 322 with power.

The first electrode 322 has a mash-shape. The first electrode 322 attracts the ions, so that the ions are accelerated and pass through the first electrode 322.

The first power supply 324 applies voltage that has a polarity opposite to the ion to the first electrode 322.

The absolute value of the voltage determines the magnitude of acceleration. When the absolute value becomes larger, the magnitude of acceleration becomes larger. The larger the absolute value of the voltage is, the larger is the magnitude of acceleration.

The second ion beam generating part 330 modulates a shape of the first ion beam. In detail, the second ion beam generating part 330 reduces cross-sectional area of the first ion beam, while not reducing the amount of the first ion beam. Therefore, the second ion beam generating part 330 focuses the first ion beam.

The second ion beam generating part 330 includes a second ion beam housing 332, a second electrode 334 and a second power supply 336.

The second ion beam housing 332 has a hollow prism shape that has three faces. The second ion beam housing 332 has a hollow. A first ion beam inlet 333a is formed on a face of the second ion beam housing 332 that faces the first ion beam generating part 320. A second ion beam outlet 333b is formed on an edge of the second ion beam housing 332 that faces the first ion beam inlet 333a. The first ion beam is focused by the second ion beam outlet 333b and exits though the second ion beam outlet 333b to form a second ion beam.

The second electrode 334 is installed in the first ion beam inlet 333a of the second ion beam housing 332. The second electrode 334 has a mesh-shape and includes a conductive material.

The second power supply 336 provides the second electrode 334 with a voltage, which has a polarity opposite to the polarity of the first ion beam, so that the first ion beam is accelerated once more.

The atomic beam generating part 340 includes an electron generating unit 342 and an electron accelerating unit 346.

The electron generating unit 342 includes a tungsten filament 343 and power supply 344 for applying power voltage to the tungsten filament 343. The tungsten filament 343 is heated by the power supply 344. When a temperature of the tungsten filament 343 is above about 2500K, electrons are emitted from the tungsten filament 343.

The electron accelerating unit 346 includes an electron acceleration electrode 347 and power supply 348 for supplying the electron accelerating unit 346 with power voltage. The electron accelerating unit 346 faces the tungsten filament 343 and attracts the electrons generated from the tungsten filament 343 so that electron beam is formed.

The electron generating unit 342 and the electron accelerating unit 346 are disposed, such that a virtual line connecting the electron generating unit 342 with the electron accelerating unit 346 intersects the direction of advancing of the second electron beam. Therefore, electron beam generated from the electron generating unit 342 and accelerated by the electron accelerating unit 346 intersects the second ion beam. The electrons of the electron beam are combined with the second ion beam, so that the second ion beam is transformed into the atomic beam that has substantially the same speed and direction as those of the second ion beam.

A sequence of the first ion beam generating part and the second ion beam generating part 330 may be changed. Only the second ion beam generating part 330 may be disposed between the ion generating part 310 and the atomic beam generating part 340. The second ion beam generating part 330 may have various shapes. The first ion beam inlet 333a may have a circular shape, and the second ion beam outlet 333b may have a rectangular shape.

Eleventh Embodiment of Non-contact Type Alignment of liquid Crystal Molecules

Figure 24:
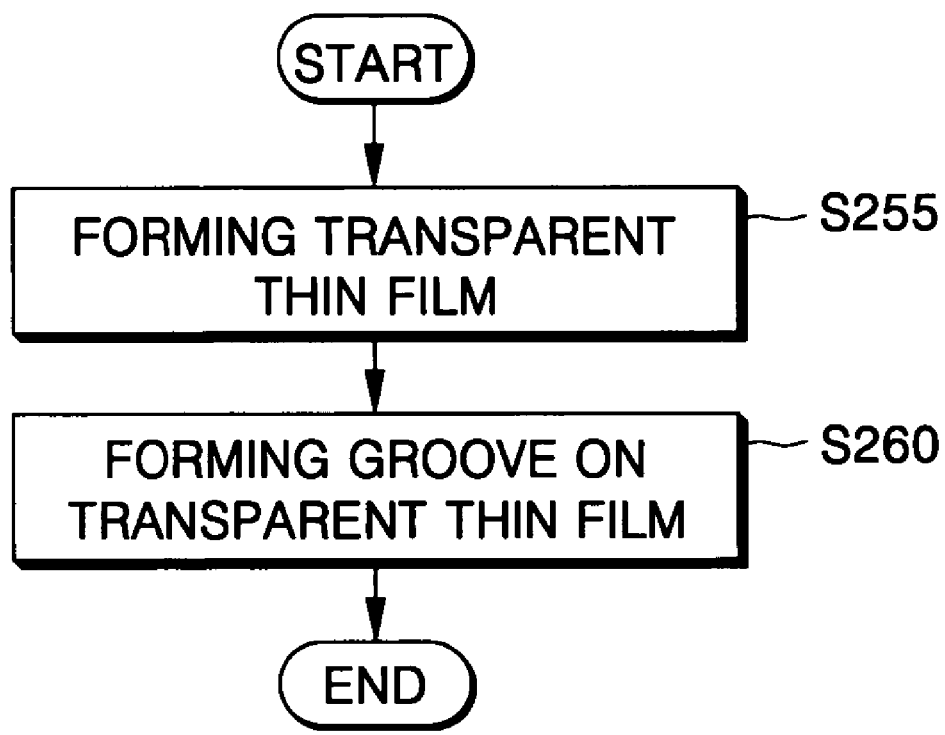
FIG. 24 is a flow chart showing a non-contact aligning method of aligning liquid crystal molecule on an alignment film according to eleventh embodiment of the present invention.
Figure 26:
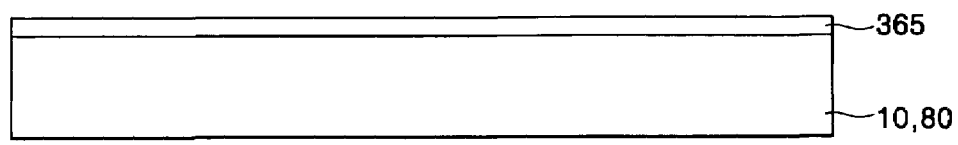
FIG. 26 is a cross-sectional view showing a transparent thin film formed on a mother substrate.
Figure 27:
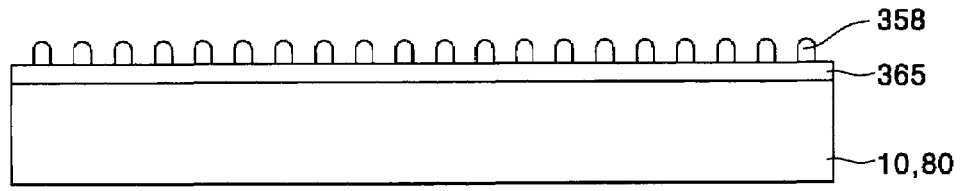
FIG. 27 is a cross-sectional view showing a carbon polymer formed on the transparent thin film of FIG. 26.

FIG. 24 is a flow chart showing a non-contact aligning method of aligning liquid crystal molecule on an alignment film according to eleventh embodiment of the present invention, FIG. 26 is a cross-sectional view showing a transparent thin film formed on a mother substrate, and FIG. 27 is a cross-sectional view showing a carbon polymer formed on the transparent thin film of FIG. 26.

Referring to FIGS. 24, 26 and 27, a transparent thin film 365 is formed on the thin film transistor unit cell 30 of the first mother substrate 10 so as to align liquid crystal molecule on the first mother substrate 10. The transparent thin film 365 is formed also the color filter unit cell 100 of the second mother substrate 80 so as to align liquid crystal molecule on the second mother substrate 80 (step S255).

Firstly, the first mother substrate 10 or the second mother substrate 80 are loaded in a vacuum space that is sealed in order to form the transparent thin film. Amorphous silicon thin film may be used as the transparent thin film.

In order to form the transparent thin film on the first mother substrate 10 or on the second mother substrate 80 in the sealed vacuum space, silane gas ($SiH_4$) and hydrogen gas are provided in the space. Then, the silane gas and the hydrogen gas are reacted with each other to form amorphous silicon. The amorphous silicon is deposited on the thin film transistor unit cell 30 of the first mother substrate 10 or on the color filter unit cell 100 of the second mother substrate 80, so that the transparent amorphous silicon thin film is formed.

When the transparent thin film is formed on the first mother substrate 10 or on the second mother substrate 80, alignment grooves for aligning liquid crystal molecule are formed on the first mother substrate 10 or on the second mother substrate 80 (step S260).

The alignment grooves are formed on polymers, when the polymers are deposited on the first mother substrate 10 or on the second mother substrate 80.

In order to deposit polymers on the first mother substrate 10 or on the second mother substrate 80, fluorocarbon ($CF_4$), trifluoromethane ($CHF_3$) and oxygen ($O_2$) are supplied to the sealed space that has a low pressure. Then, the fluorocarbon ($CF_4$), trifluoromethane ($CHF_3$) and oxygen ($O_2$) form the carbon polymer via Chemical Vapor Deposition (CVD).

The carbon polymer is deposited on the first mother substrate 10 or on the second mother substrate 80, such as snow is deposited on a ground. The carbon polymer is deposited in island shapes that are spaced apart with each other. That is, the carbon polymer is not deposited on the whole surface of the first mother substrate 10 or on the second mother substrate 80. The islands of carbon polymers are formed via a similar process to the process in which seed for forming hemispherical grain (HSG) is scattered uniformly.

Preferably, the islands have enough intervals so that liquid crystal molecule may be disposed between the islands, and the height of the islands is in the range from about 10 Å to about 100 Å. The carbon polymer is grown directly upward from the first mother substrate 10 or on the second mother substrate 80.

Twelfth Embodiment of Non-contact Type alignment of liquid Crstal Molecules

Figure 25:
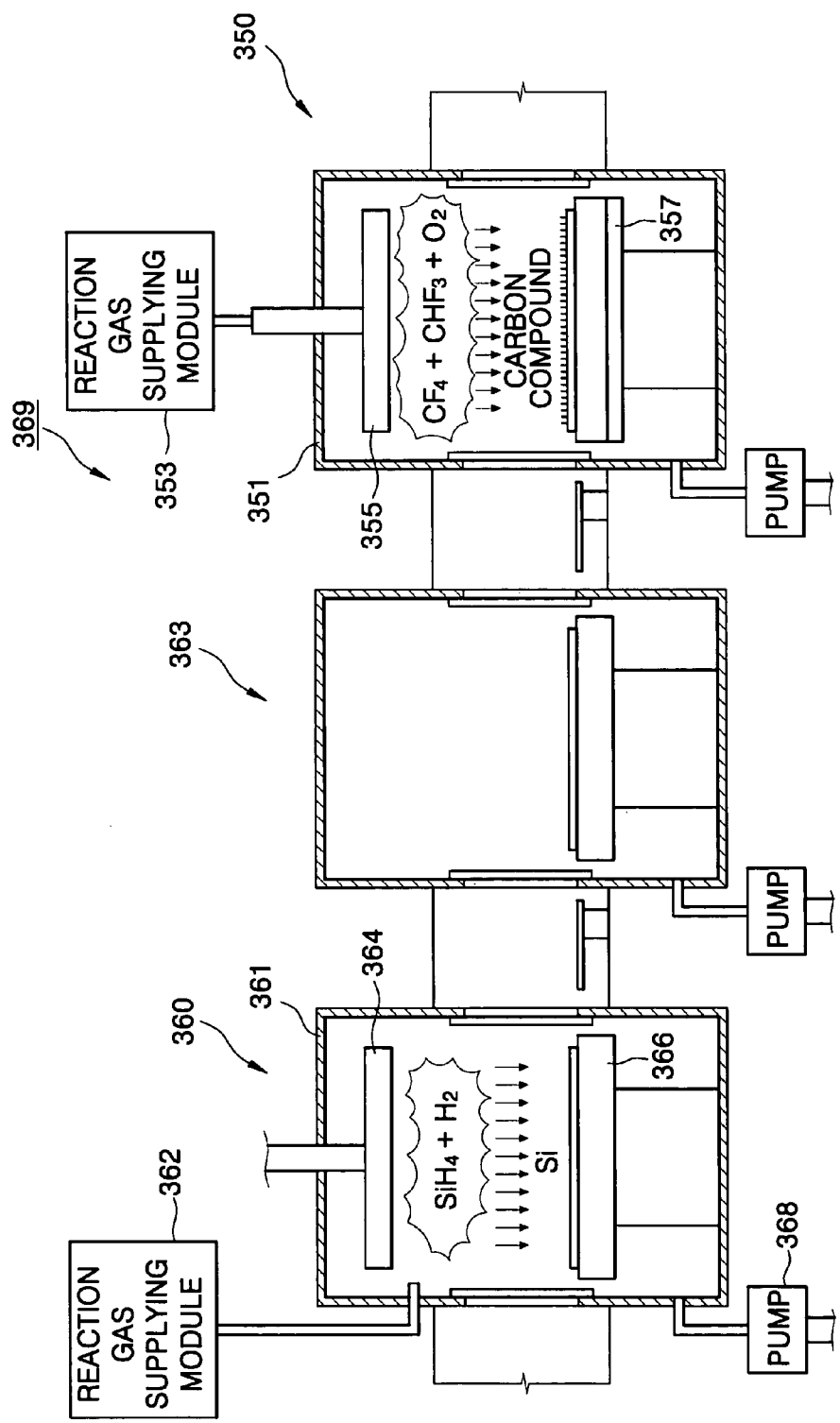
FIG. 25 is a schematic view showing a non-contact alignment device according to a twelfth exemplary embodiment of the present invention.

FIG. 25 is a schematic view showing a non-contact alignment device according to a twelfth exemplary embodiment of the present invention. FIG. 26 is a cross-sectional view showing a transparent thin film formed on a mother substrate. FIG. 27 is a cross-sectional view showing a carbon polymer formed on the transparent thin film of FIG. 26.

Referring to FIGS. 25 to 27, a non-contact alignment device 369 includes a thin film forming part 360 and a groove forming part 350.

The thin film forming part 360 includes a thin film forming chamber 361, a reaction gas supplying module 362, a plasma generator having a cathode electrode 364 and an anode electrode 366, and a vacuum pump 368.

The reaction gas supplying module 362 supplies the thin film forming chamber 361 with silane gas ($SiH_4$) and hydrogen gas ($H_2$).

The plasma generator includes a cathode electrode 364 and an anode electrode 366. High voltage is applied between the cathode electrode 364 and the anode electrode 366, so that the silane gas ($SiH_4$) and the hydrogen gas ($H_2$) are reacted with each other.

Referring to FIG. 26, a transparent thin film 365, such as amorphous silicon thin film, is formed on a first mother substrate 10 or on a second mother substrate 80 with silane gas ($SiH_4$) and hydrogen gas ($H_2$).

Referring again to FIG. 25, the first mother substrate 10 or the second mother substrate 80 having the transparent thin film is transferred to a load lock chamber 363. The first mother substrate 10 or the second mother substrate 80 stands by for the next procedure in the load lock chamber 363.

The groove forming part 350 includes a groove forming chamber 351, a reaction gas supplying module 353, a reaction gas polymerization unit having a cathode electrode 355 and an anode electrode 357.

The pressure in the groove forming chamber 351 is maintained at a high-vacuum. The first mother substrate 10 having the transparent thin film or the second mother substrate 80 having a transparent thin film is transferred to the groove forming chamber 351.

The transparent thin film includes amorphous silicon thin film.

The reaction gas supplying module 353 supplies the groove forming chamber 351 with a reaction gas. The reaction gas forms carbon polymer on the transparent thin film.

Referring to FIG. 27, carbon polymers 358 are formed on a transparent thin film 365. The carbon polymers 358 are formed to be spaced apart with each other like islands. A longitudinal direction of the carbon polymers 358 is substantially perpendicular to the surface of the transparent thin film 365. It is preferable that the height of the carbon polymers 358 is in the range from about 10 Å to about 100 Å. The reaction gas includes fluorocarbon ($CF_4$), trifluoromethane ($CHF_3$) and oxygen ($O_2$) for polymerize the fluorocarbon ($CF_4$) and trifluoromethane ($CHF_3$).

Referring again to FIG. 25, the reaction gas polymerization unit 355 and 357 allows the reaction gas to react with each other so as to produce the carbon polymer 358 of FIG. 27. The reaction gas polymerization unit includes the cathode electrode 355, the anode electrode 357 and power supply (not shown). The cathode electrode 355 and the anode electrode 357 transform the oxygen into plasma.

The power supply (not shown) provides the cathode electrode 355 and the anode electrode 357 with enough voltage to transform the oxygen into plasma state.

The groove forming part 350 forms the carbon polymer. The islands of carbon polymers are formed via a similar process to the process in which seed for forming hemispherical grain (HSG) is scattered uniformly.

Referring again to FIG. 1, the island-shaped carbon polymer is referred to as an alignment film. The alignment film is formed as above described method (step S200).

When the alignment film is formed of the thin film transistor unit cell 30 of the first mother substrate 10 and on the color filter unit cell 100 of the second mother substrate 80, the first mother substrate 10 and the second mother substrate 80 are assembled into an assembled substrate (step S300).

The first mother substrate 10 and the second mother substrate 80 are erected to be disposed parallel to the gravitational force direction and loaded into Automatically Guided Vehicle (AGV) or Manually Guided Vehicle (MGV) and transferred to assembled substrate manufacturing device.

In order to form the assembled substrate, a fence is formed on one of the thin film transistor unit cell 30 and the color filter unit cell 100 (step S305). The number of the thin film transistor unit cell 30 formed on the first mother substrate 10 is equal to the number of the color filter unit cell 100 formed on the second mother substrate 80.

The fence includes a curable material and an adhesive material. The curable material is cured, when an ultra-violet beam is irradiated onto the curable material. The adhesive material combines the first mother substrate 10 with second mother substrate 80. The fence has a band-shape that has a narrow width, and the fence surrounds an edge of the thin film transistor unit cell 30 or an edge of the color filter unit cell 100 to form a closed loop.

Liquid crystal is dropped into an internal region defined by the fence so as to fill up the internal region defined by the fence (step S310).

An amount of liquid crystal filled into the internal region is calculated based on an area that is surrounded by the fence and cell gap that is a distance between the thin film transistor unit cell 30 and the color filter unit cell 100 when the thin film transistor unit cell 30 and the color filter unit cell 100 are assembled.

When the liquid crystal is dropped into the internal region, the liquid crystal is dropped on a plurality of regions that is disposed in the internal region.

Then, the first mother substrate 10 and the second mother substrate 80 are assembled together in vacuum. The fence intermediates between the first mother substrate 10 and the second mother substrate 80. Hereinafter, the thin film transistor unit cell 30 of the first mother substrate 10 and the color filter unit cell 100 of the second mother substrate 80 are referred to as a liquid crystal display unit cell.

The first mother substrate 10 and the second mother substrate 80 including the liquid crystal display unit cell are left under atmospheric pressure for one hour, so that the liquid crystal dropped on a plurality of regions is uniformly spread.

However, even when the first mother substrate 10 and the second mother substrate 80 including the liquid crystal display unit cell are left under atmospheric pressure for one hour, the liquid crystal of some of the liquid crystal display unit cell is not spread. When the liquid crystal is not spread uniformly throughout the entire liquid crystal display unit cell, an image is not displayed in a liquid crystal unfilled region of the liquid crystal display unit cell, where the liquid crystal does not exist.

Therefore, after the first mother substrate 10 and the second mother substrate 80 including the liquid crystal display unit cell are left under atmospheric pressure for one hour, a detecting process for detecting the liquid crystal unfilled region is performed. The detecting process is not essential. The detecting process is performed only for reducing the product failure.

Figure 28:
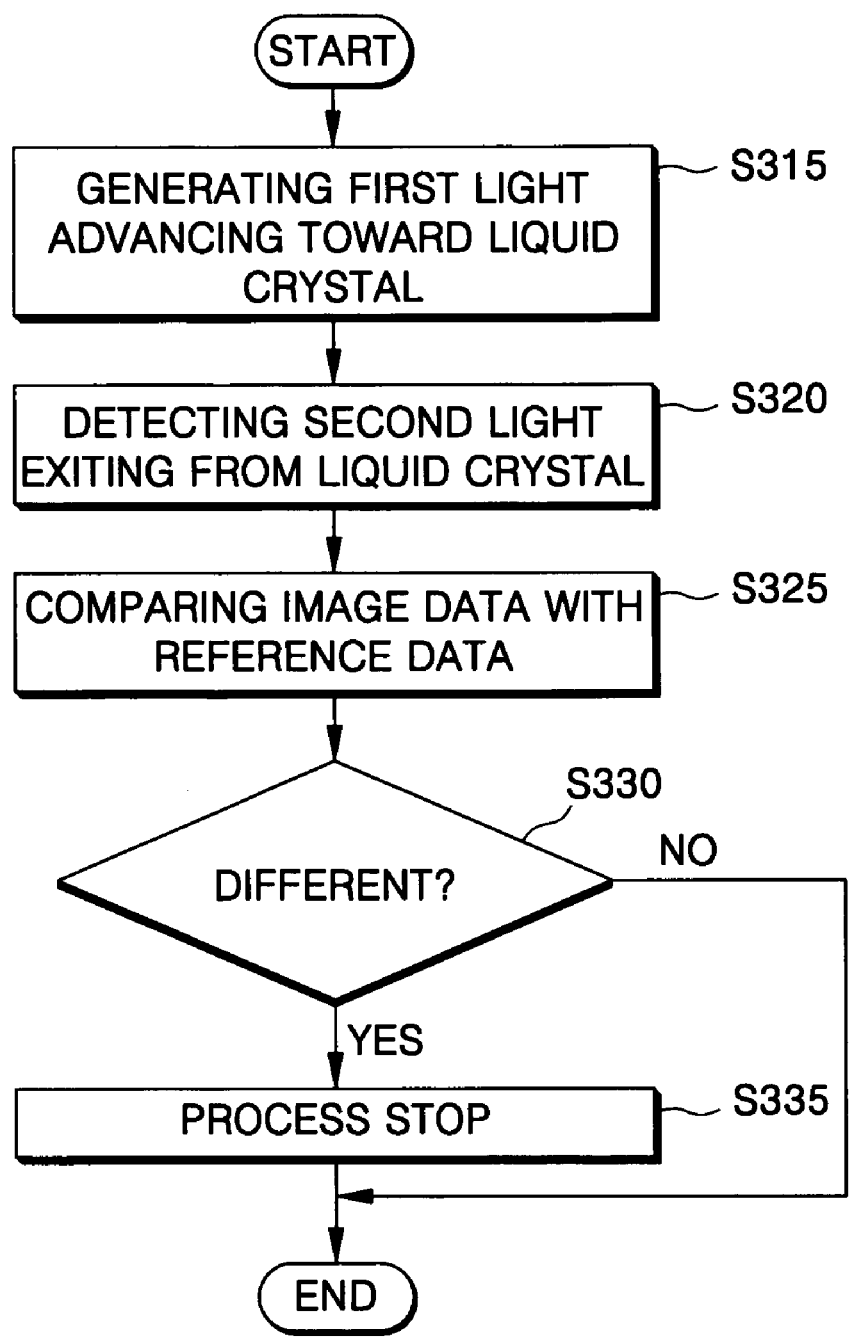
FIG. 28 is a flow chart showing a method for detecting unfilled region in which the liquid crystal is not filled.

FIG. 28 is a flow chart showing a method for detecting unfilled region in which the liquid crystal is not filled.

Referring to FIG. 28, a first light is generated (step S315) in order to detect the liquid crystal unfilled region. The first light arrives at a bottom face of the first mother substrate 10 and passes though the first mother substrate 10, liquid crystal disposed on the first mother substrate. When the first light passes through the liquid crystal, the first light is transformed into a second light that has different characteristics from that of the first light.

The second light passes through the second mother substrate 80 and exits from an upper face of the second mother substrate 80.

The second light that exits from the second mother substrate 80 is detected (step S320).

The detected second light generates an analog signal. The analog signal is transformed into an image data that is a digital signal. The image data is compared with reference data (step S325).

When the image data are different from the reference data, the liquid crystal unfilled region exists in the liquid crystal display unit cell. Therefore, the first mother substrate 10 and the second mother substrate 80 including the liquid crystal display unit cell are stood by at an atmospheric pressure for another two hours (step S335).

In order to spread the liquid crystal, an external force may be applied to the liquid crystal display unit cell.

When the liquid crystal unfilled region is not detected, the ultra-violet beam is irradiated onto the fence that combines the first mother substrate 10 with the second mother substrate 80 so as to cure the fence.

Hereinafter, a detecting device for detecting the liquid crystal unfilled region is described in detail.

Figure 29:
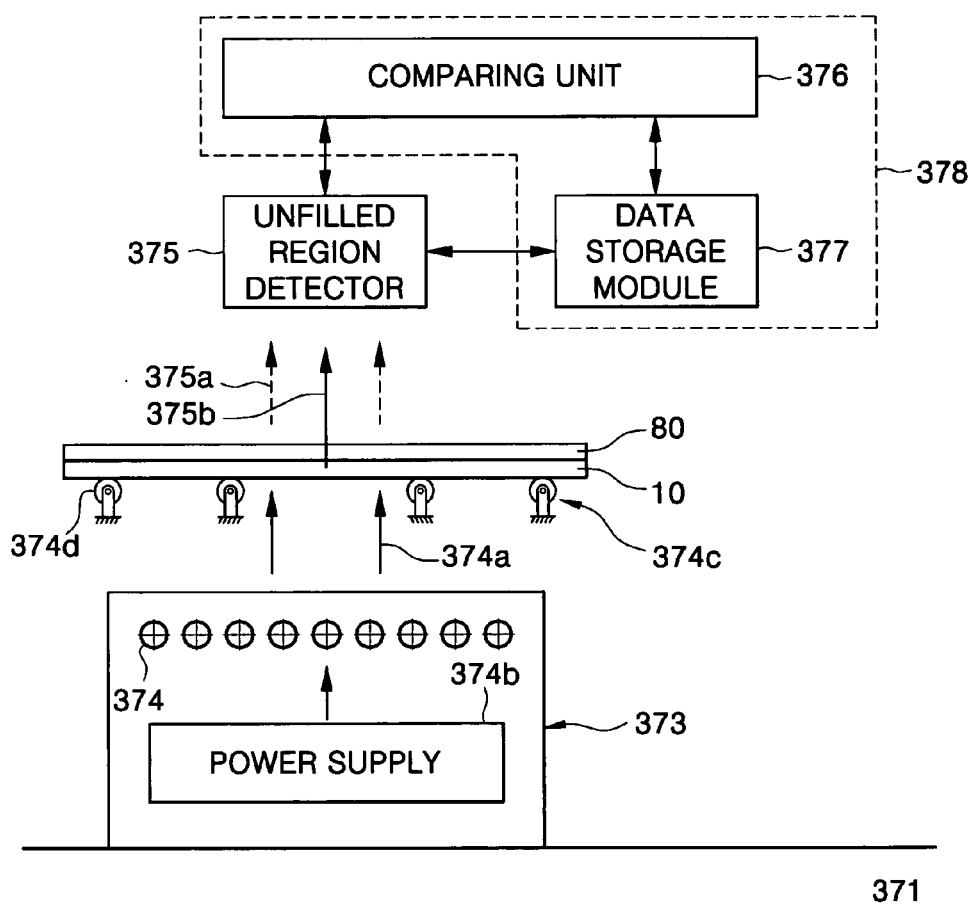
FIG. 29 is a schematic view showing an example of detecting device for detecting the unfilled region.

FIG. 29 is a schematic view showing an example of detecting device for detecting the unfilled region.

Referring to FIG. 29, a detecting device for detecting the liquid crystal unfilled region includes a base body 371, a back light unit 373, an unfilled region detector 375 and a control unit 378.

The back light unit 373, the unfilled region detector 375 and the control unit 378 are installed in the base body 371.

The back light unit 373 includes lamps 374 for generating first light 374a, and the power supply 374b for supplying the lamps with power. A transferring unit 374c is formed over the back light unit 373. The transferring unit 374c loads/unloads the first mother substrate 10 and the second mother substrate 80 assembled with each other into/from the base body 371. The transferring unit 374c includes rollers 374d arranged along a line and a roller driving unit (not shown) for driving the rollers 374d. The rollers 374d makes contact with the first mother substrate 10.

The unfilled region detector 375 faces the back light unit 373.

The unfilled region detector 375 detects second light 375a and third light 375b. When the first light 374a passes through the liquid crystal, the first light 374a is transformed into the second light 375a. When the first light 374a passes through the unfilled region, the first light 374a is transformed into the third light 375b.

The second light 375a has a different luminance and a different color in comparison with the third light 375b. Therefore, the second light 375a and the third light 375b may be detected by the luminance and the color.

A charge coupled device camera (CCD camera) may be used as the unfilled region detector 375. The charge coupled device camera receives the second light 375a and the third light 375b to generate an analog image and to transform the analog image into image data. The image data are stored in the data storage module 377 of the control unit 378. Hereinafter, the image data detected from an assembled substrate that is being inspected is referred to a detected data. Hereinafter, the image data detected from the assembled substrate that has no unfilled region is referred to as reference data.

The comparing unit 376 compares the detected data with the reference data.

The reference data do not include data that are obtained from the third light 375b. When an assembled substrate has unfilled region, detecting data detected from the assembled substrate includes data that are obtained from the second light 375a and data that are obtained from the third light 375b.

The comparing unit 376 compares the detected data stored in the data storage module 377 with the reference data. When the detected data is substantially equal to the reference data, the comparing unit 376 concludes that the assembled substrate has no unfilled region. When the detected data are different from the reference data, the comparing unit 376 concludes that the assembled substrate has unfilled region.

When the detecting procedure is finished, the assembled substrate is erected to be disposed in parallel with the gravitational force direction and transferred by Automatically Guided Vehicle (AGV) or Manually Guided Vehicle (MGV) to a non-contact inspecting device that inspects the liquid crystal display unit cell.

Referring again to FIG. 1, when the liquid crystal is supplied (step S500), the liquid crystal display unit cell is inspected, whether the liquid crystal display unit cell is normal or not (step S400) before the liquid crystal display unit cell is separated from the first mother substrate 10 and the second mother substrate 80.

In general, the liquid crystal display unit cell is inspected, whether the liquid crystal display unit cell has defects or not, after the liquid crystal display unit cell is separated from the first mother substrate 10 and the second mother substrate 80.

However, in the present invention, the sequence is changed. According to the exemplary embodiment of the present invention, the liquid crystal display unit cell is inspected, whether the liquid crystal display unit cell has defects or not, before the liquid crystal display unit cell is separated from the first mother substrate 10 and the second mother substrate 80.

It may be hard to inspect the liquid crystal display unit cell before the liquid crystal display unit cell is separated, because input terminal for receiving a signal that drives the liquid crystal display unit cell is disposed between the first mother substrate 10 and the second mother substrate 80.

Hereinafter, a method of examining the liquid crystal display unit cell by applying a test signal to the input terminal disposed between the first mother substrate and the second mother substrate will be explained.

Figure 30A:
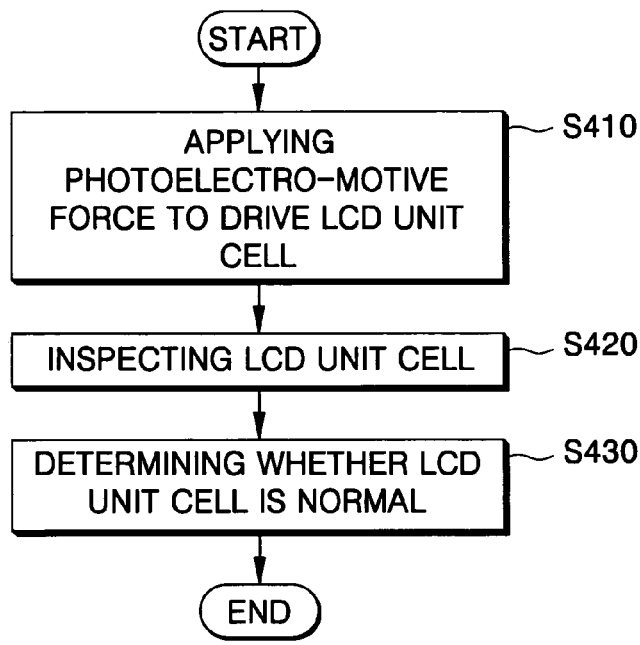
FIG. 30A is a flow chart showing a non-contact inspecting method of inspecting the liquid crystal display unit cell.

FIG. 30A is a flow chart showing a non-contact inspecting method of inspecting the liquid crystal display unit cell.

Referring to FIG. 30A, in order to drive the liquid crystal display unit cell, photoelectro-motive force is applied to the liquid crystal display unit cell (step S410).

Figure 30B:
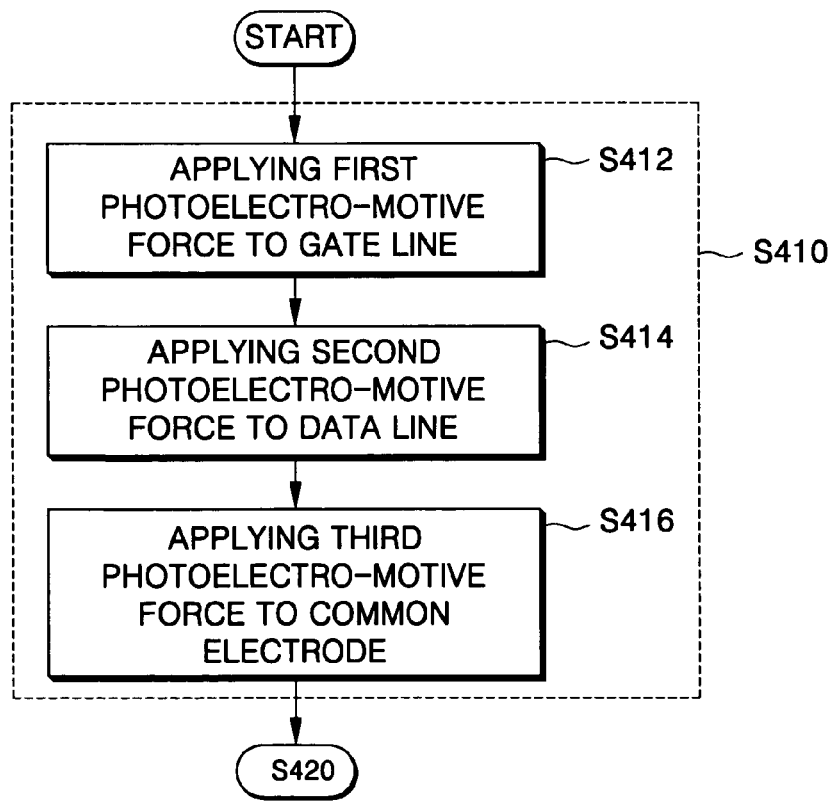
FIG. 30B is a flow chart showing a method of driving the liquid crystal display unit cell of FIG. 30A.

FIG. 30B is a flow chart showing a method of driving the liquid crystal display unit cell of FIG. 30A.

Referring to FIGS. 3, 6 and 30B, the first light is applied to a gate line, so that a first photoelectro-motive force is applied to the gate line 50 of the thin film transistor unit cell 50 (step S412). The second light is applied to a data line, so that a second photoelectro-motive force is applied to the data line 60 of the thin film transistor unit cell 50 (step S414). A third light may be applied, so that a third photoelectro-motive force is applied to a common electrode (not shown) of the color filter unit cell 100 (step S416).

The first photoelectro-motive force may be applied to at least two gate lines 50, simultaneously. The first photoelectro-motive force may be applied to one of the gate lines 50. The first photoelectro-motive force is large enough to turn on the thin film transistor 40. However, the first photoelectro-motive force is not too large to damage the channel layer 48 of the thin film transistor 40.

The second photoelectro-motive force may be applied to at least two data lines 60, simultaneously. Alternatively, the second photoelectro-motive force may be applied to one of the data lines 60. The second photoelectro-motive force is applied to the source electrode 44 of the thin film transistor 40. The second photoelectro-motive force may be differently applied to each of the data lines 60 so as to display a test image.

The third photoelectro-motive force may be applied to the common electrode 120 of FIG. 6. A magnitude of the third photoelectro-motive force is different from those of the first photoelectro-motive force and the second photoelectro-motive force. The third photoelectro-motive force may be connected to an earth potential. When the third photoelectro-motive force is connected to the earth potential, the third light may not be applied.

When the first photoelectro-motive force is applied to the gate line, the thin film transistor 40 is turned on. Then, the second photoelectro-motive force that is applied to the data lo lines 60 is transferred to the pixel electrode 70, so that alignment of the liquid crystal molecules disposed between the pixel electrode 70 and the common electrode 120 is changed. When the alignment of the liquid crystal molecules disposed between the first mother substrate 10 and the second mother substrate 80 is changed, the light that passes through the liquid crystal display device is transformed into the test image.

By the test image, the liquid crystal display unit cell is inspected, whether the liquid crystal display unit cell is normal or not (step S420).

Figure 30C:
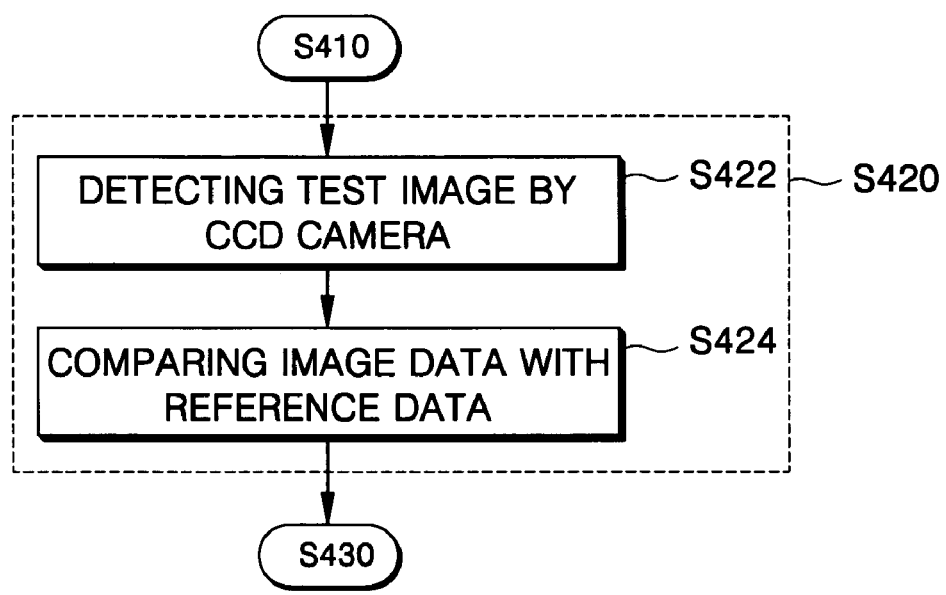
FIG. 30C is a flow chart showing a method of inspecting the liquid crystal display unit cell of FIG. 30A.

FIG. 30C is a flow chart showing a method of inspecting the liquid crystal display unit cell of FIG. 30A.

Referring to FIGS. 30A and 30C, the charge coupled device (CCD) camera detects the test image and transforms the test image into image data (step S422). The liquid crystal display unit cell determines whether the liquid crystal display unit cell is normal or not (step S430) by comparing the image data with reference data (step S424).

When the liquid crystal display unit cell is not normal, the liquid crystal display unit cell marked as an abnormal unit cell to show that liquid crystal display unit cell is not normal.

As described above, the liquid crystal display unit cell is inspected whether the liquid crystal display unit cell is normal or not by non-contact alignment method, in order to attach polarizing plate only to a normal liquid crystal display unit cell.

Figure 31:
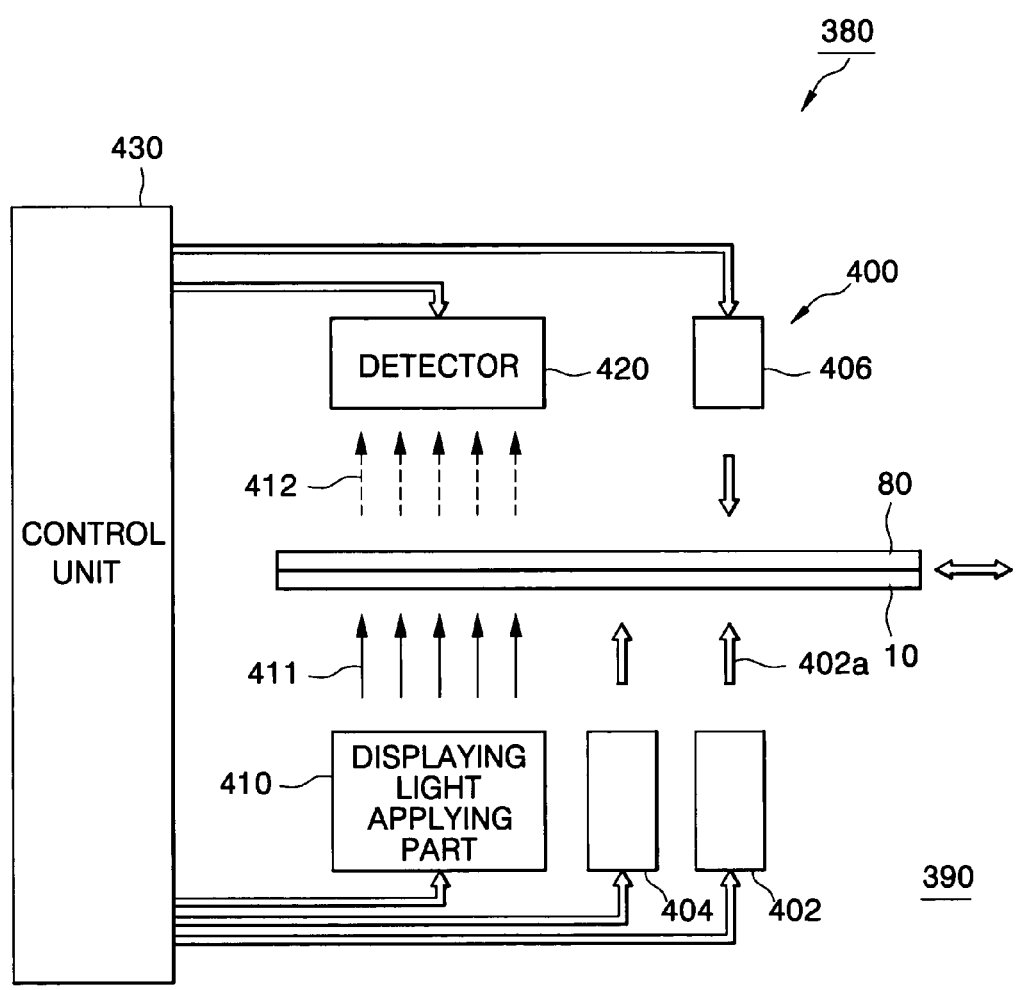
FIG. 31 is a schematic view showing an example of a non-contact inspecting device.

FIG. 31 is a schematic view showing an example of a non-contact inspecting device.

Referring to FIG. 3 and FIG. 31, an inspecting device 380 includes a base body 390, a photoelectro-motive force applying part 400, a display light applying part 410, a detector 420 and a control unit 430.

The first mother substrate 10 and the second mother substrate 80 where the liquid crystal display unit cell is formed are loaded on (or unloaded from) the base body 390.

The photoelectro-motive force applying part 400 includes a first photoelectro-motive force applying part 402, a second photoelectro-motive force applying part 404 and a third photoelectro-motive force applying part 406.

The first photoelectro-motive force applying part 402 applies a first photoelectro-motive force to the gate line 50 of the thin film transistor unit cell 30 to turn on the thin film transistor 40. The first photoelectro-motive force may be applied to at least two gate lines 50 simultaneously or one gate line 50.

The second photoelectro-motive force applying part 404 applies a second photoelectro-motive force to the data line 60 of the thin film transistor unit cell 30 so as to apply the second photoelectro-motive force to the source electrode 44. The second photoelectro-motive force is transferred to the pixel electrode 70 via the drain electrode 46.

Referring to FIG. 6 and FIG. 31, the third photoelectro-motive force applying part 406 applies a third photoelectro-motive force to the common electrode 120 of the color filter unit cell. Then, an electric field is formed between the common electrode 120 and the pixel electrode of FIG. 3 to change an alignment of the liquid crystal molecule.

However, when a display light 411 is absent, an operation of the liquid crystal display unit cell may not be perceived.

The display light applying part 410 applies the display light 411 that advances toward the first mother substrate 10.

The detector 80 detects a test image 412. When the display light 411 passes through the first mother substrate 10, a liquid crystal disposed on the first mother substrate 10 and the second mother substrate 80, the display light 411 is transformed into the test image 412. The detector 420 transforms an analog signal into a digital signal. For example, a charge coupled device (CCD) camera may be used as the detector 420.

The control unit 430 examines the operation of the liquid crystal display unit cell by comparing the digital signal with reference signal.

When the liquid crystal display unit cell is examined whether or not the liquid crystal display unit cell is normal, the assembled substrate is erected and transferred to next procedure of attaching a polarizing plate to the liquid crystal display unit cell that is normal.

Figure 32:
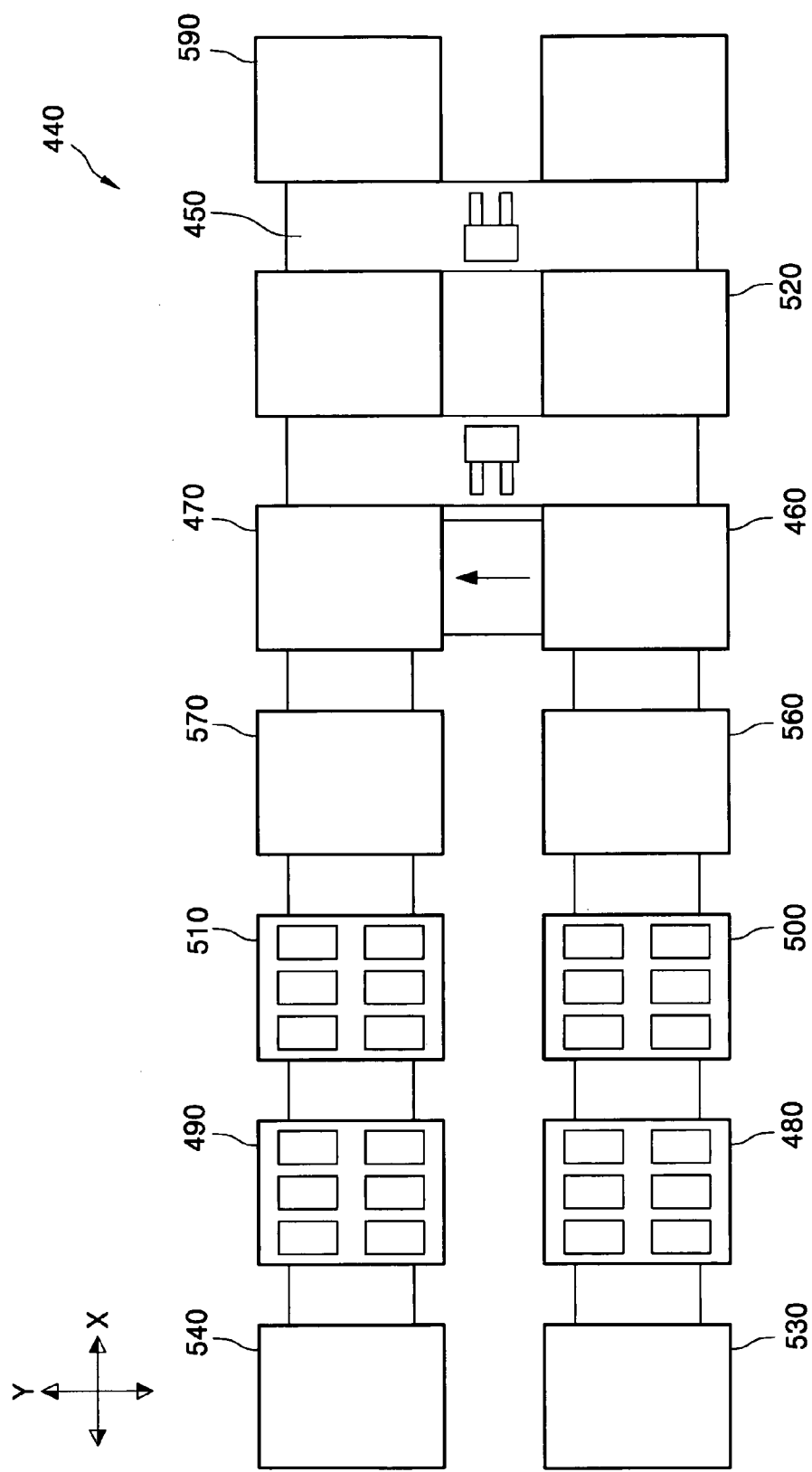
FIG. 32 is a schematic view showing an example of an attaching device for attaching a polarizing plate to the liquid crystal display unit cell.

FIG. 32 is a schematic view showing an example of an attaching device for attaching a polarizing plate to the liquid crystal display unit cell.

Referring to FIG. 32, an attaching device 440 includes a base body 450, a first polarizing plate attaching module 460, a second polarizing plate attaching module 470, a first cutting out module 480, a second cutting out module 490, a first protection sheet strip module 500 and a second protection sheet strip module 510.

The base body 450 provides a space where the first polarizing plate attaching module 460, the second polarizing plate attaching module 470, the first cutting out module 480, the second cutting out module 490, the first protection sheet strip module 500 and the second protection sheet strip module 510 are installed.

For example, the base body 450 may have a box shape. A longitudinal direction of the base body 450 is referred to as an x-direction, and a lateral direction of the base body 450 is referred to as a y-direction.

An assembled substrate loader 520 is formed on the base body 450. An assembled substrate that is inspected whether or not the assembled substrate is normal is loaded on the assembled substrate loader 520.

A first polarizing plate loader 530 and a second polarizing plate loader 540 are disposed on the base body 450. The first polarizing plate loader 530 and the second polarizing plate loader 540 are spaced apart from the assembled substrate loader 520. The first polarizing plate loader 530 and the second polarizing plate loader 540 are parallel with each other, and disposed in the y-direction.

The first polarizing plate has substantially an equal size to the assembled substrate. The first polarizing plates that are attached onto the thin film transistor unit cell are loaded on the first polarizing plate loader 530.

Figure 33:
FIG. 33 is a cross-sectional view showing a first mother polarizing plate.

FIG. 33 is a cross-sectional view showing a first mother polarizing plate.

Referring to FIG. 33, a first mother polarizing plate 534 includes a first base film 531, a first polarizing plate 532 and a first protection sheet 533.

The first mother polarizing plate 534 may have a smaller size than the assembled substrate. For example, the liquid crystal display unit cell is arranged in a 3×2 matrix shape, the first mother polarizing plate 534 may be a large enough in size to form three first polarizing plates 532 or two first polarizing plates 532.

Referring again to FIG. 32, the second polarizing plate has a substantially equal size to the assembled substrate. The second polarizing plates that are attached onto the color filter unit cell are loaded on the second polarizing plate loader 540.

The second mother polarizing plate 544 may have a smaller size than the assembled substrate. For example, the liquid crystal display unit cell is arranged in a 3×2 matrix shape, the second mother polarizing plate 544 may be large enough in size to form three first polarizing plates 532 or two first polarizing plates 532.

Figure 34:
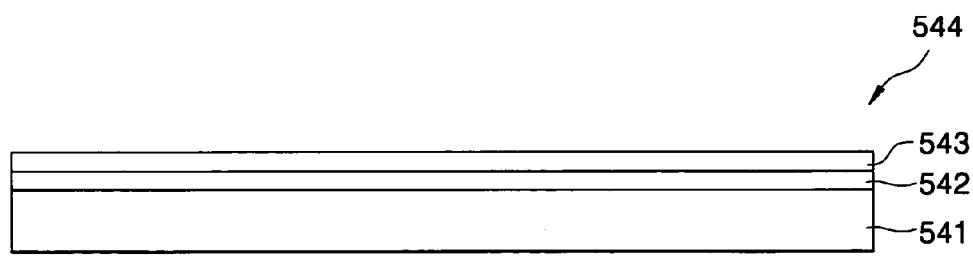
FIG. 34 is a cross-sectional view showing a second mother polarizing plate.

FIG. 34 is a cross-sectional view showing a second mother polarizing plate.

Referring to FIG. 34, a second mother polarizing plate 544 includes a second base film 541, a second polarizing plate 542 and a second protection sheet 543.

Referring again to FIG. 32, a first cutting out module 480 and a second cutting out module 490 are formed on the base body 450.

The first cutting out module 480 is disposed adjacent to the first polarizing plate loader 530. The second cutting out module 490 is disposed adjacent to the second polarizing plate loader 540.

The first cutting out module 480 cuts out the first mother polarizing plate in accordance with a size of the thin film transistor unit cell. The first cutting out module 480 cuts out the first mother polarizing plates 534, such that a number and a size of the first mother polarizing plates 534 are equal to a number and a size of the thin film transistor unit cells. The first cutting out module 480 may cut out the first mother polarizing plates 534, which are included in one column or on row of the thin film transistor unit cells arranged in a matrix shape.

Figure 35:
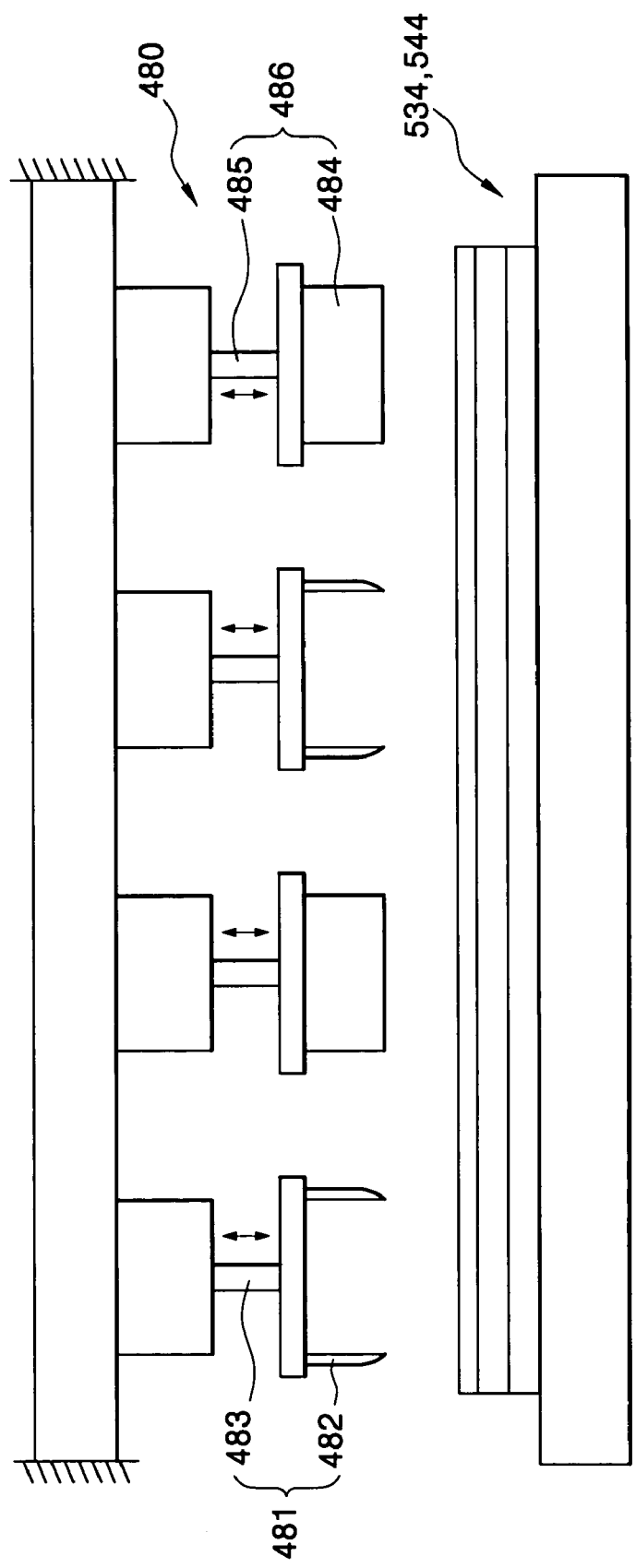
FIG. 35 is a schematic view showing an example of a first cutting-out module of FIG. 32.

The second cutting out module 490 cuts out the second mother polarizing plate in accordance with a size of the color filter unit cell. The second cutting out module 490 cuts out the second mother polarizing plates 544, such that a number and a size of the second mother polarizing plates 544 are equal to a number and a size of the thin film transistor unit cells. The second cutting out module 490 may cut out the second mother polarizing plates 544, which are included in one column or on row of the thin film transistor unit cells arranged in a matrix shape. FIG. 35 is a schematic view showing an example of a first cutting-out module of FIG. 32.

Referring to FIG. 35, a first cutting out module 480 includes an x-axis blade module 481 and a y-axis blade module 486.

The x-axis blade module 481 includes a first x-axis blade 482 and a first x-axis blade driving unit 483. The length of the first x-axis blade 482 is equal to an x-direction length of the thin film transistor unit cell. The first x-axis blade driving unit 483 pushes and pulls the first x-axis blade 482, such that a first protection sheet 533 and a first polarizing plate 532 are completely cut and a portion of a first base film 531 is cut.

Figure 36:
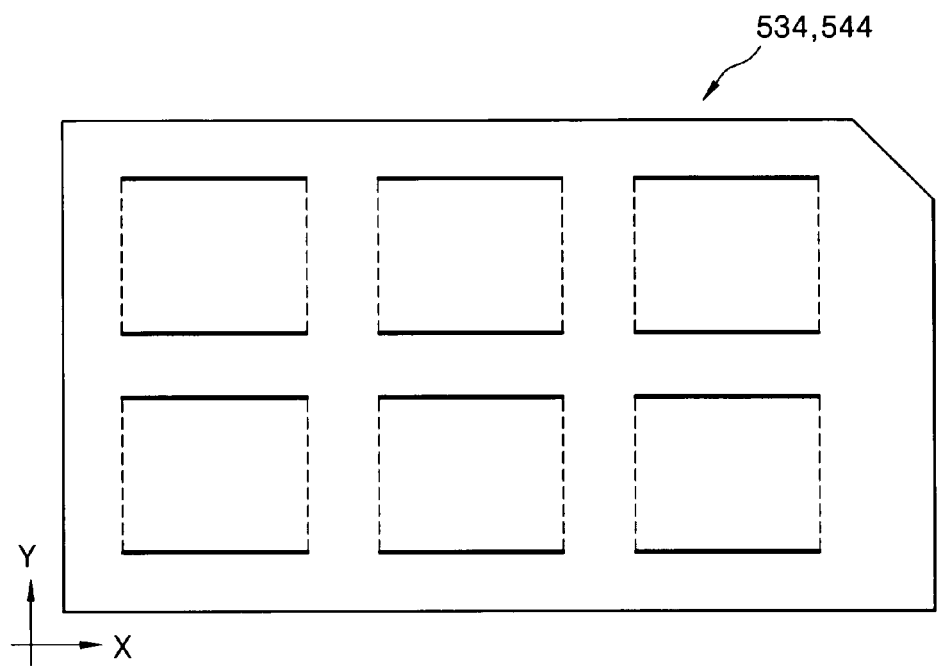
FIG. 36 is a schematic view showing a first (or second) mother polarizing plate cut out by a first x-axis blade of FIG. 35.

FIG. 36A is a schematic view showing a first (or second) mother polarizing plate cut out by a first x-axis blade of FIG. 35.

Referring to FIG. 36A, a first mother polarizing plate 534 is cut by the first x-axis blade module 481 of FIG. 35.

FIGS. 36B and 36C are schematic views showing a first (or second) mother polarizing plate cut out partially by a first x-axis blade of FIG.

Referring to FIGS. 36B and 36C, the first x-axis blade cuts out a left portion of a first polarizing plate having large size. The first x-axis blade cuts out a right portion of the first polarizing plate, so that a horizontal edge of the first polarizing plate is completely cut out from the first mother polarizing plate.

When the first x-axis blade driving unit pushes the first x-axis blade having large so as to cut the first polarizing plate having large size, the first mother polarizing plate may be damaged. Therefore, the first polarizing plate is cut out at two times.

When the first polarizing plate is cut out at many times, the polarizing plate may be less damaged but the cutting time is increased.

When the first polarizing plate is large, a first ratio of a first length of the first x-axis blade to a length of the horizontal edge of the first polarizing plate in the first direction is in a range from about 0.5 to about 1.

Referring again to FIG. 35, the y-axis blade module 486 includes a first y-axis blade 484 and a first y-axis blade driving unit 485. The length of the first y-axis blade 484 is equal to an y-direction length of the thin film transistor unit cell. The first y-axis blade driving unit 485 pushes and pulls the first y-axis blade 484 such that a first protection sheet 533 and a first polarizing plate 532 are completely cut and a portion of a first base film 531 is cut.

Figure 37:
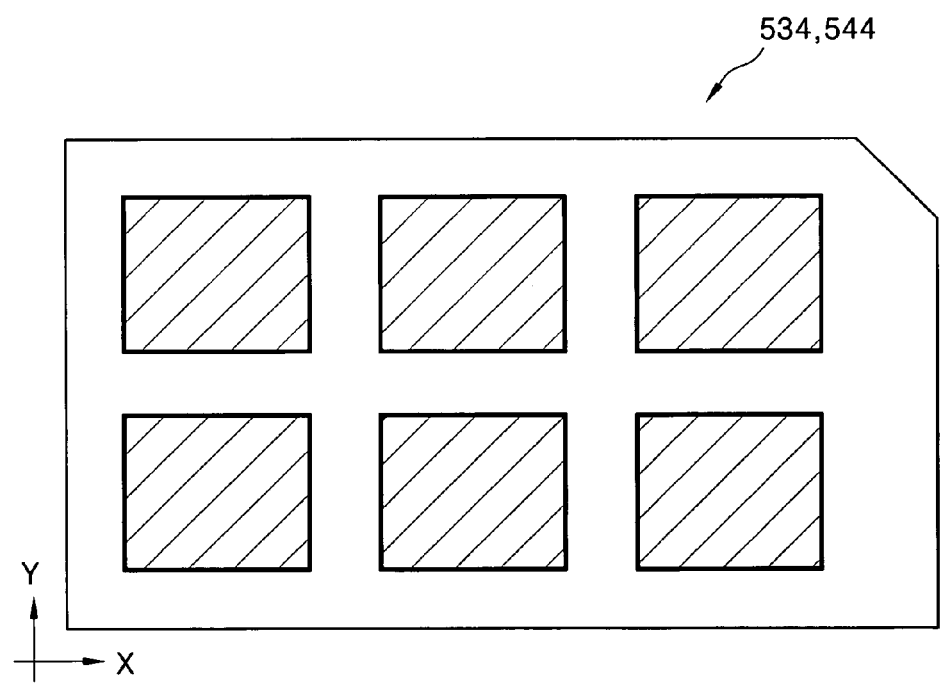
FIG. 37 is a schematic view showing a first (or second) mother polarizing plate cut out by a first y-axis blade after cut out by the first x-axis blade of FIG. 35.

FIG. 37A is a schematic view showing a first (or second) mother polarizing plate cut out by a first y-axis blade after cut out by the first x-axis blade of FIG. 35.

Referring to FIGS. 33 and 37A, a first mother polarizing plate 534 is cut by the first y-axis blade module 486 of FIG. 35 so that a first polarizing plate 532 of the first mother polarizing plate 534 is cut to have a substantially equal size to the thin film transistor unit cell.

FIGS. 37B and 37C are schematic views showing a first (or second) mother polarizing plate cut out by a first y-axis blade after cut out partially by the first x-axis blade of FIG. 35.

Referring to FIGS. 37B and 37C, the first y-axis blade cuts out an upper portion of a first polarizing plate having large size. The first y-axis blade cuts out a lower portion of the first polarizing plate, so that a vertical edge of the first polarizing plate is completely cut out from the first mother polarizing plate.

When the first y-axis blade driving unit pushes the first y-axis blade having large so as to cut the first polarizing plate having large size, the first mother polarizing plate may be damaged. Therefore, the first polarizing plate is cut out at two times.

When the first polarizing plate is cut out at many times, the polarizing plate may be less damaged but the cutting time is increased.

When the first polarizing plate is large, a first ratio of a first length of the first y-axis blade to a length of the vertical edge of the first polarizing plate in the first direction is in a range from about 0.5 to about 1.

Referring again to FIG. 32, the second cutting out module 490 has an equal element with the first cutting out module 480. Therefore, an explanation of the second cutting out module 490 is omitted.

The first protection sheet strip module 500 and the second protection sheet strip module 510 are formed on the base body 450. The first protection sheet strip module 500 is disposed adjacent to the first cutting out module 480. The second protection sheet strip module 510 is disposed adjacent to the second cutting out module 490.

Figure 38:
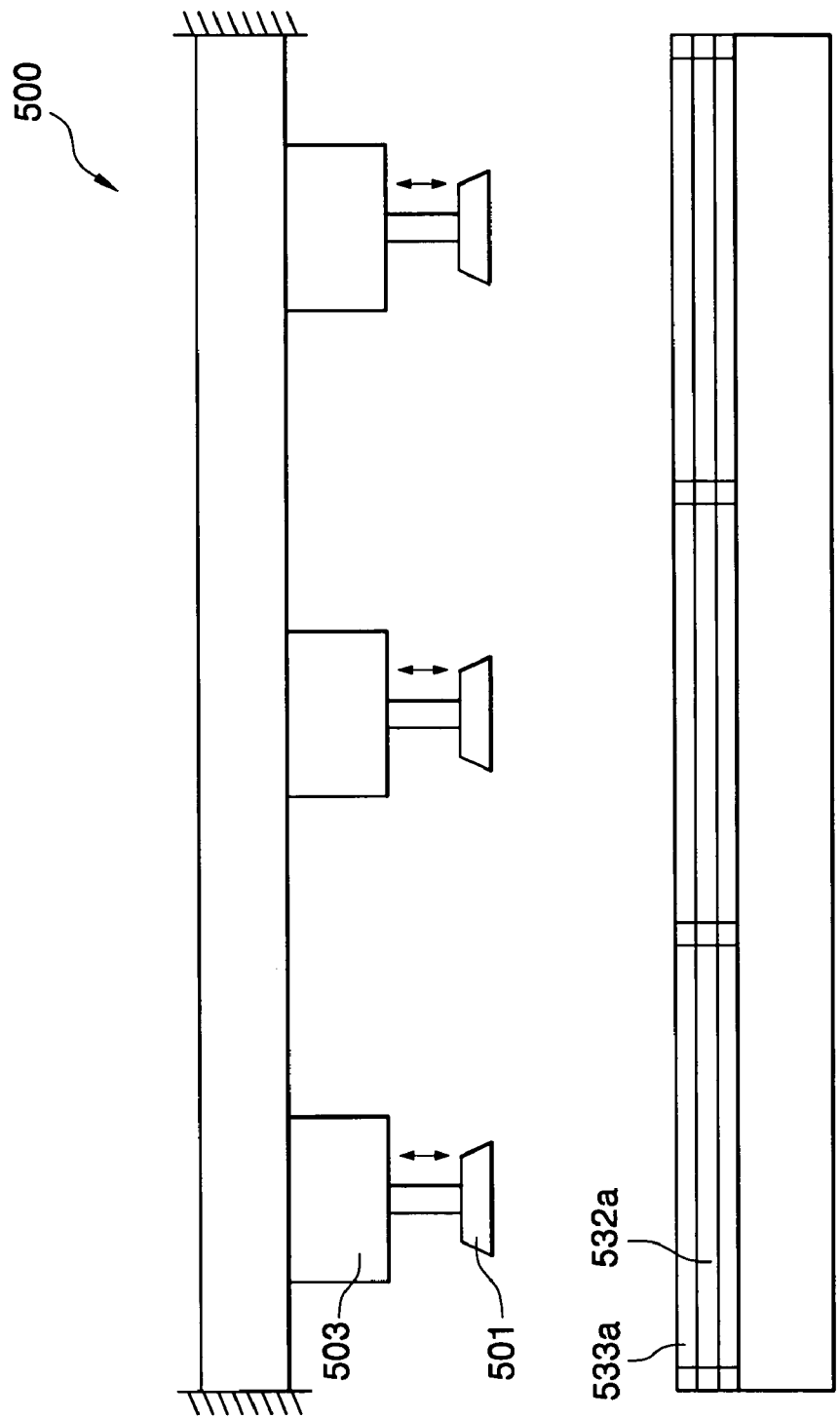
FIG. 38 is a schematic view showing a first protection-sheet strip module of FIG. 32.

FIG. 38 is a schematic view showing a first protection-sheet strip module of FIG. 32.

Referring to FIG. 38, a first protection sheet strip module 500 strips a first protection sheet 533a that is attached on the first polarizing plate 532a, after the first protection sheet 533 and the first polarizing plate 532 of FIG. 33 are cut by the first cutting out module 480 of FIG. 32.

The first protection sheet strip module 500 includes a picker 501 and a picker driving module 503.

The picker driving module 503 pushes the picker 501 such that the pick 501 makes touch with the first protection sheet 533a.

The picker 501 absorbs the first protection sheet 533a by means of vacuum pressure. Then, the picker driving module 503 pulls the picker 501. When the picker 501 absorbs the first protection sheet 533a more strongly than the adhesive power that combines the first protection sheet 533a with the first polarizing plate 532a, the first protection sheet 533a is detached from the first polarizing plate 532a.

When the first protection sheet 533a is detached from the first polarizing plate 532a, the first polarizing plate is attached on the thin film transistor unit cell of the liquid crystal display unit cell.

Referring again to FIG. 32, the second protection sheet strip module 510 has equal elements to the first protection sheet strip module 500. Therefore, an explanation of the second protection sheet strip module 510 is omitted.

A first turning over module 560 and a second turning over module 570 are formed on the base body 450. The first turning over module 560 is disposed adjacent to the first protection sheet strip module 500. The second turning over module 570 is disposed adjacent to the second protection sheet strip module 510.

The first turning over module 560 and the second turning over module 570 turn over the first mother polarizing plate and the second mother polarizing plate respectively, such that an exposed first polarizing plate of the first mother polarizing plate faces the thin film transistor unit cell and an exposed second polarizing plate of the second mother polarizing plate faces the color filter unit cell.

The first polarizing plate attaching module 460 and the second polarizing plate attaching module 470 are formed on the base body 450. The first polarizing plate attaching module 460 is disposed adjacent to the first turning over module 560. The second polarizing plate attaching module 470 is disposed adjacent to the second turning over module 570.

The first polarizing plate attaching module 460 attaches the first mother polarizing plate on the assembled substrate. The second polarizing plate attaching module 470 attaches the second mother polarizing plate on the assembled substrate.

Figure 39:
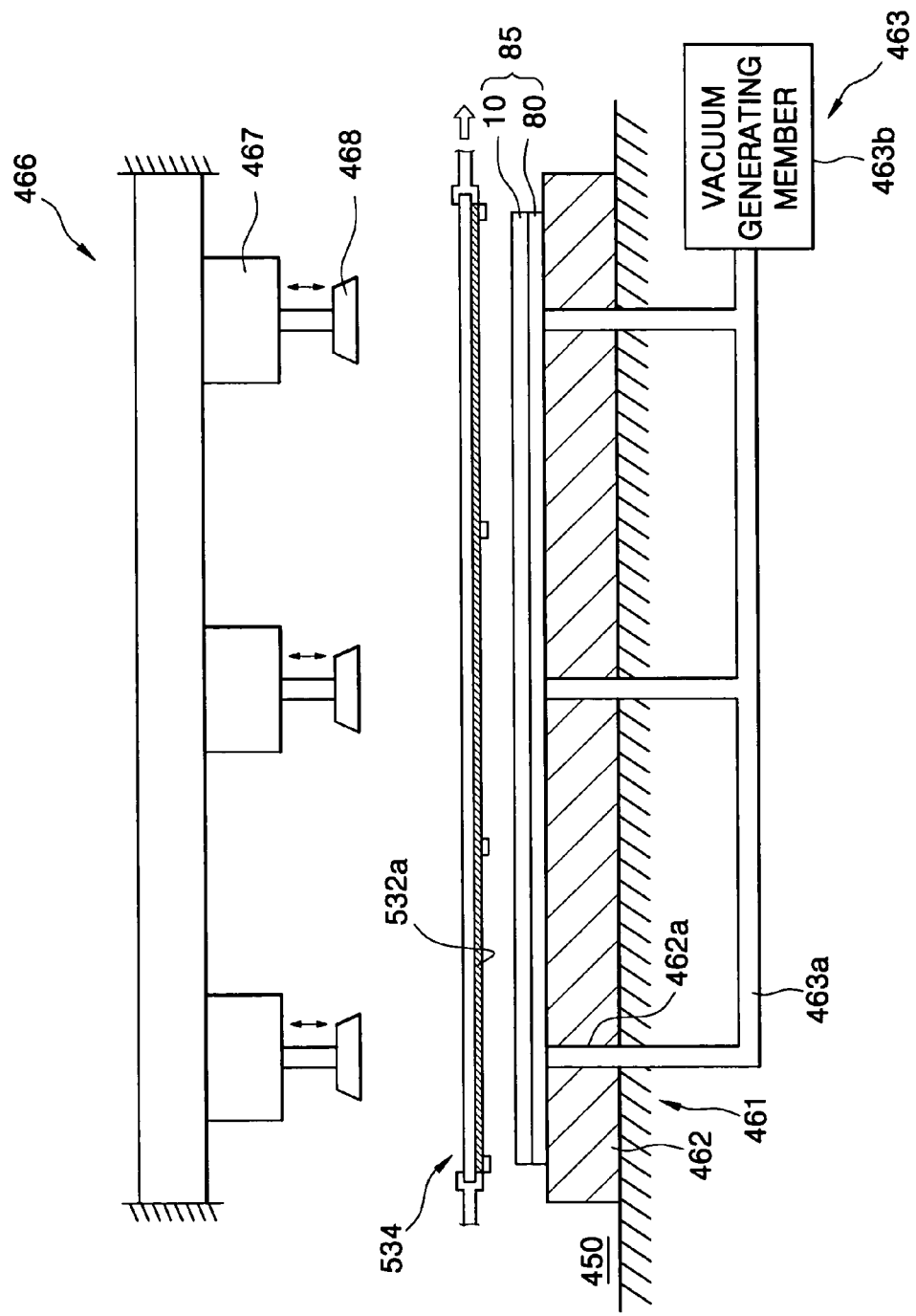
FIG. 39 is a schematic view showing a polarizing plate attaching module of FIG. 32.

FIG. 39 is a schematic view showing a polarizing plate attaching module of FIG. 32.

Referring to FIG. 39, a first polarizing plate attaching module 460 includes a first assembled substrate supporting unit 461 and the first polarizing plate attaching unit 466.

The first assembled substrate supporting unit 461 supports an assembled substrate 85. The first assembled substrate supporting unit 461 includes a first assembled substrate supporting plate 462 and a first assembled substrate absorbing part 463.

The first assembled substrate supporting plate 462 includes a plurality of first penetration holes 462a.

The first assembled substrate absorbing part 463 includes a first vacuum pipe 463a and a first vacuum generating member 463b. A first end of the first vacuum pipe 463a is connected with the first penetration hole 462a of the first assembled substrate supporting plate 462, and a second end of the first vacuum pipe 463a is connected with the first vacuum generating member 463b. The first vacuum generating member 463b forms a substantially vacuum state, so that the assembled substrate 85 is fixed to the first assembled substrate supporting plate 462.

The first polarizing plate attaching unit 466 includes a first pushing plate 468 and a first pushing plate driving module 467.

The first pushing plate driving module 467 pushes the first pushing plate 468 so that a first polarizing plate 532a of a first mother polarizing plate 534 makes a contact with the thin film transistor unit cell (not shown) of the first mother substrate 10. Therefore, the first polarizing plate 532a that is cut by the first cutting out module 480 of FIG. 32 is attached on the thin film transistor unit cell (not shown) of the first mother substrate 10.

Referring again to FIG. 32, the second polarizing plate attaching unit 470 is equal to the first polarizing plate attaching unit 460. Therefore, an explanation of the second polarizing plate attaching unit 470 is omitted.

A third tuning over module 580 is disposed between the first polarizing plate attaching module 460 and the second polarizing plate attaching module 470.

The third tuning over module 580 turns over the assembled substrate on which the first polarizing plate is attached in order that the second polarizing plate may be attached on color filter unit cell.

When the first polarizing plate is attached on the thin film transistor unit cell and the second polarizing plate is attached on the color filter unit cell, a transferring arm transfers the assembled substrate to an assembled substrate unloading module 590. Two assembled substrate unloading modules 590 are formed Referring again to FIG. 1, when the first polarizing unit cell is attached on the thin film transistor unit cell of the assembled substrate and the second polarizing unit cell is attached on the color filter unit cell of the assembled substrate, the liquid crystal display unit cell is separated from the assembled substrate by a non-contact method using a laser beam or by a contact method using a diamond blade (step S500).

The liquid crystal display unit cell that is separated from the assembled substrate is referred to as a liquid crystal display panel.

A flexible tape carrier package (TCP) and a printed circuit board (PCB) is attached onto the liquid crystal display panel so as to manufacture a liquid crystal display panel assembly (step S600).

The liquid crystal display panel assembly is combined with a back light assembly, so that a liquid crystal display device is manufactured.

While the exemplary embodiments of the present invention and its advantages have been described in detail, it should be understood that various changes, substitutions and alterations can be made herein without departing from the spirit and scope of the invention as defined by appended claims.

What is claimed is:

1. A method of forming an alignment film comprising:
    forming a first ion beam;
    transforming the first ion beam into a second ion beam;
    transforming the second ion beam into an atomic beam;
    irradiating the atomic beam onto a thin film including a carbon-carbon double bond to form a polarized functional group by transforming the carbon-carbon double bond into a carbon-carbon single bond and a radical state; and
    combining a polarity preserving material with the polarized functional group so as to preserve a polarity of the polarized functional group.

2. The method of claim 1, wherein the polarity preserving material is a hydroxyl radical (OH—), water being provided to a surface of the thin film, so that the hydroxyl radical (OH—) is combined with the polarized functional group.

3. The method of claim 2, wherein the water is in a vapor state.

4. The method of claim 1, wherein the polarity preserving material is combined with the polarized functional group by:
    providing water to a surface of the thin film including the polarized functional group; and
    irradiating an ultraviolet light onto the surface of the thin film to combine hydrogen ions with the polarized functional group.

5. The method of claim 1, wherein the polarity preserving material is combined with the polarized functional group by:
    dissociating nitrogen gas into nitrogen ions at a pressure that is lower than an atmospheric pressure; and
    providing the nitrogen ions to the surface of the thin film to combine the nitrogen ions with the polarized functional group.

6. The method of claim 5, wherein the nitrogen gas is heated at a temperature above about 2500K to be dissociated into the nitrogen ions.

7. The method of claim 5, wherein the nitrogen gas undergoes electric fields to be dissociated into the nitrogen ions.

8. The method of claim 1, wherein the polarity preserving material is hydrogen ions, hydrogen gas being dissociated into the hydrogen ions under vacuum, so that the hydrogen ions being combined with the polarized functional group.

9. The method of claim 8, wherein the hydrogen gas is heated to be transformed into hydrogen ions at a temperature above about 2500K.

10. The method of claim 8, wherein the hydrogen gas is dissociated by applying electric fields to the hydrogen gas.

11. The method of claim 1, wherein
    the first ion beam forms a first angle with respect to the thin film and a cross section of the second ion beam has a square-shape.

12. The method of claim 11, wherein the first ion beam is formed by:
    providing a source gas;
    dissociating the source gas into ions; and
    accelerating the ions to form the first ion beam.

13. The method of claim 12, wherein the source gas is an argon (Ar) gas.

14. The method of claim 12, wherein the argon (Ar) gas is heated at a temperature above about 2500K to be dissociated into argon ions.

15. The method of claim 12, wherein the argon (Ar) gas is dissociated by applying plasma-generating electric fields to the argon (Ar) gas.

16. The method of claim 11, wherein the first ion beam is allowed to pass through an outlet of a housing to be focused.

17. The method of claim 16, wherein the outlet of the housing has a rectangular shape.

18. The method of claim 11, wherein the atomic beam is formed through intersecting the second ion beam with an electron beam.

19. The method of claim 18, wherein the electron beam is formed by:
    heating a tungsten filament to emit electrons; and
    accelerating the electrons in a direction that is substantially perpendicular to a direction of the second ion beam.

20. The method of claim 19, wherein the electrons are accelerated due to an electrode having a positive polarity, the electrode being disposed at an opposite position to the tungsten filament with respect to the second ion beam.

* * * * *